United States Patent
Ueda et al.

(10) Patent No.: US 8,362,791 B2
(45) Date of Patent: Jan. 29, 2013

(54) TEST APPARATUS ADDITIONAL MODULE AND TEST METHOD

(75) Inventors: Motoo Ueda, Saitama (JP); Satoshi Iwamoto, Saitama (JP); Masaru Goishi, Saitama (JP); Hiroyasu Nakayama, Saitama (JP); Masaru Tsuto, Saitama (JP)

(73) Assignee: Advantest Corporation, Tokyo (JP)

( * ) Notice: Subject to any disclaimer, the term of this patent is extended or adjusted under 35 U.S.C. 154(b) by 577 days.

(21) Appl. No.: 12/557,468

(22) Filed: Sep. 10, 2009

(65) Prior Publication Data
US 2010/0102840 A1 Apr. 29, 2010

Related U.S. Application Data

(63) Continuation-in-part of application No. PCT/JP2009/002783, filed on Jun. 18, 2009, which is a continuation-in-part of application No. 12/329,635, filed on Dec. 8, 2008, now Pat. No. 8,059,547.

(60) Provisional application No. 61/074,151, filed on Jun. 20, 2008.

(51) Int. Cl.
*G01R 31/28* (2006.01)
*G01R 31/00* (2006.01)

(52) U.S. Cl. .......... 324/754.01; 324/754.07; 324/754.1; 324/756.05; 324/763.01; 702/120; 702/122; 714/724; 714/743

(58) Field of Classification Search ..... 324/537–762.02; 714/724–742; 702/120–122
See application file for complete search history.

(56) References Cited

U.S. PATENT DOCUMENTS

| | | | |
|---|---|---|---|
| 6,301,190 B1 | 10/2001 | Tsujino et al. | |
| 6,490,700 B1 | 12/2002 | Oshima et al. | |
| 6,536,006 B1 * | 3/2003 | Sugamori | 714/724 |
| 7,679,372 B2 * | 3/2010 | Kurihara et al. | 324/537 |
| 2002/0016941 A1 | 2/2002 | Tsubo | |
| 2002/0048211 A1 | 4/2002 | Tsujino | |
| 2002/0059545 A1 | 5/2002 | Nakashima et al. | |
| 2004/0264506 A1 | 12/2004 | Furukawa | |
| 2008/0114563 A1 | 5/2008 | Kappauf et al. | |
| 2008/0297165 A1 * | 12/2008 | Kurihara et al. | 324/537 |
| 2010/0164527 A1 * | 7/2010 | Weyh et al. | 324/763 |

FOREIGN PATENT DOCUMENTS

| | | |
|---|---|---|
| JP | H7-321750 A | 12/1995 |
| JP | H11-17768 A | 1/1999 |
| JP | 2000-40391 A | 2/2000 |
| JP | 2001-134469 A | 5/2001 |
| JP | 2001-195899 A | 7/2001 |
| JP | 2002-50196 A | 2/2002 |

(Continued)

OTHER PUBLICATIONS

Evans, "The New ATE: Protocol Aware", Test Conference, IEEE International, Oct. 2007, pp. 1-10, Santa Clara, CA.
Japanese Office Action dated Apr. 13, 2010, in a counterpart Japanese patent application of U.S. Appl. No. 61/074,151. Partial translation of the Office Action is attached as a concise explanation of relevance.

(Continued)

*Primary Examiner* — Melissa Koval
*Assistant Examiner* — Emily Chan

(57) ABSTRACT

A test apparatus includes: test modules that communicate with the device under test to test the device under test; additional modules connected between the device under test and the test modules, each additional module performing a communication with the device under test, the communication being at least one of a communication performed at a higher speed and a communication performed with a lower latency, in comparison with a communication performed by the test modules; a test head having a plurality of connectors that connect the test modules and the additional modules, respectively, the test modules and the additional modules are mounted on the test head; a performance board placed on the test head that connects between at least a part of terminals of the plurality of connectors and the device under test. The test modules are connected to the additional modules without through the performance board.

18 Claims, 21 Drawing Sheets

FOREIGN PATENT DOCUMENTS

| | | |
|---|---|---|
| JP | 2002-124099 A | 4/2002 |
| JP | 2002-152317 A | 5/2002 |
| JP | 2002-174670 A | 6/2002 |
| JP | 2003-344492 A | 12/2003 |
| JP | 2004-32145 A | 1/2004 |
| JP | 2004-48394 A | 2/2004 |
| JP | 2004-120675 A | 4/2004 |
| JP | 2004-253864 A | 9/2004 |
| JP | 2005-17992 A | 1/2005 |
| JP | 2006-352290 A | 12/2006 |
| JP | 2007-108041 A | 4/2007 |
| JP | 2008-65872 A | 3/2008 |
| JP | 2008-072191 A | 3/2008 |
| WO | 2006/058082 A1 | 6/2006 |
| WO | 2008/008227 A1 | 1/2008 |

OTHER PUBLICATIONS

JPO Office action dated Jul. 27, 2010, in counterpart Japanese patent application No. 2010-504353.

Written Opinion (PCT/ISA/237) issued in PCT/JP2009/002783 (parent application) mailed in Sep. 2009.

International Search Report (ISR) for PCT/JP2009/002783 for Examiner consideration.

Applicants bring the attention of the Examiners to the following pending; U.S. Appl. No. 12/569,776, filed Sep. 29, 2009, U.S. Appl. No. 12/569,806, filed Sep. 29, 2009 and U.S. Appl. No. 12/569,796, filed Sep. 29, 2009.

Japanese Office Action dated Nov. 16, 2010, in counterpart Japanese patent application No. 2010-504353.

* cited by examiner

PACKET LIST

| //seq | packet | parameter | address |
|---|---|---|---|
| IDXI 2 | WRITE_A | | xxxxxxx |
| NOP | WRITE_B | n=16 | xxxxxxx |
| IDXI 2 | READ_A | | xxxxxxx |
| NOP | READ_B | n=32 | xxxxxxx |
| EXIT | IDLE | | xxxxxxx |

*FIG.19*

WRITE PACKET

| //seq | ctrl | data |
|---|---|---|
| NOP | | 0×0F // start code |
| NOP | REG1 = 0 | 0×01 // command |
| IDX1 2 | REG1 = REG1^DB1 | DB1 // address (2 words) |
| IDX1 4 | REG1 = REG1^DB2 | DB2 // data (4 words) |
| NOP | | REG1 // check code |
| RTN | | 0×FF // end code |

*FIG.20*

TEST APPARATUS ADDITIONAL MODULE AND TEST METHOD

CROSS REFERENCE TO RELATED APPLICATION

This is a continuation in-part application of PCT/JP2009/002783 filed on Jun. 18, 2009 which claims priority from U.S. Patent Applications No. 61/074,151 filed on Jun. 20, 2008, and No. 12/329,635 filed on Dec. 8, 2008, the contents of which are incorporated herein by reference. PCT/JP2009/002783, which designates the United States, is a non-provisional of provisional application No. 61/074,151. This application is also a continuation-in-part of prior copending application Ser. No. 12/329,635, filed on Dec. 8, 2008.

BACKGROUND

1. Technical Field

The present invention relates to a test apparatus, an additional module and a test method.

2. Related Art

Generally, a test apparatus for testing such as a semiconductor device has been known. In the test apparatus, test modules mounted in a test head perform a test program to receive and transmit signals from/to a device under test placed on a performance board, so that the device under test is tested.

Recently, however devices which indeterminately perform increase, such that output cycles of signals are not fixed and output values change based on some condition. Here, a test module usually output a signal with a waveform previously defined by the test program, therefore the response could slow when the test module communicates with such device indeterminately performing.

Moreover, recently devices under test increases, which employ a memory performing communications with low latency to achieve nanosecond order of handshake as an external memory. When such devices under test are tested, the test apparatus has to have test modules being capable of generating test signals in response to communications between devices under test and the external memory. However, it is difficult for the test apparatus to achieve a handshake by the test modules within a time period that the devices under test require because wiring between the device under test and the test modules is long.

SUMMARY

According to a first aspect related to the innovations herein, one exemplary test apparatus for testing a device under test may includes: test modules that communicate with the device under test to test the device under test; additional modules connected between the device under test and the test modules, each additional module performing a communication with the device under test, the communication being at least one of a communication performed at a higher speed and a communication performed with a lower latency, in comparison with a communication performed by the test modules; a test head having a plurality of connectors that connect the test modules and the additional modules, respectively, the test modules and the additional modules are mounted on the test head; a performance board placed on the test head that connects between at least a part of terminals of the plurality of connectors and the device under test. Here, the test module is connected to the additional module without through the performance board. In addition, there are provided the additional modules used for such test apparatus, and a test method by using the test apparatus.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

BRIEF DESCRIPTION OF THE DRAWINGS

FIG. 19 shows an exemplary packet list according to the present embodiment.

FIG. 20 shows an exemplary packet function according to the present embodiment.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
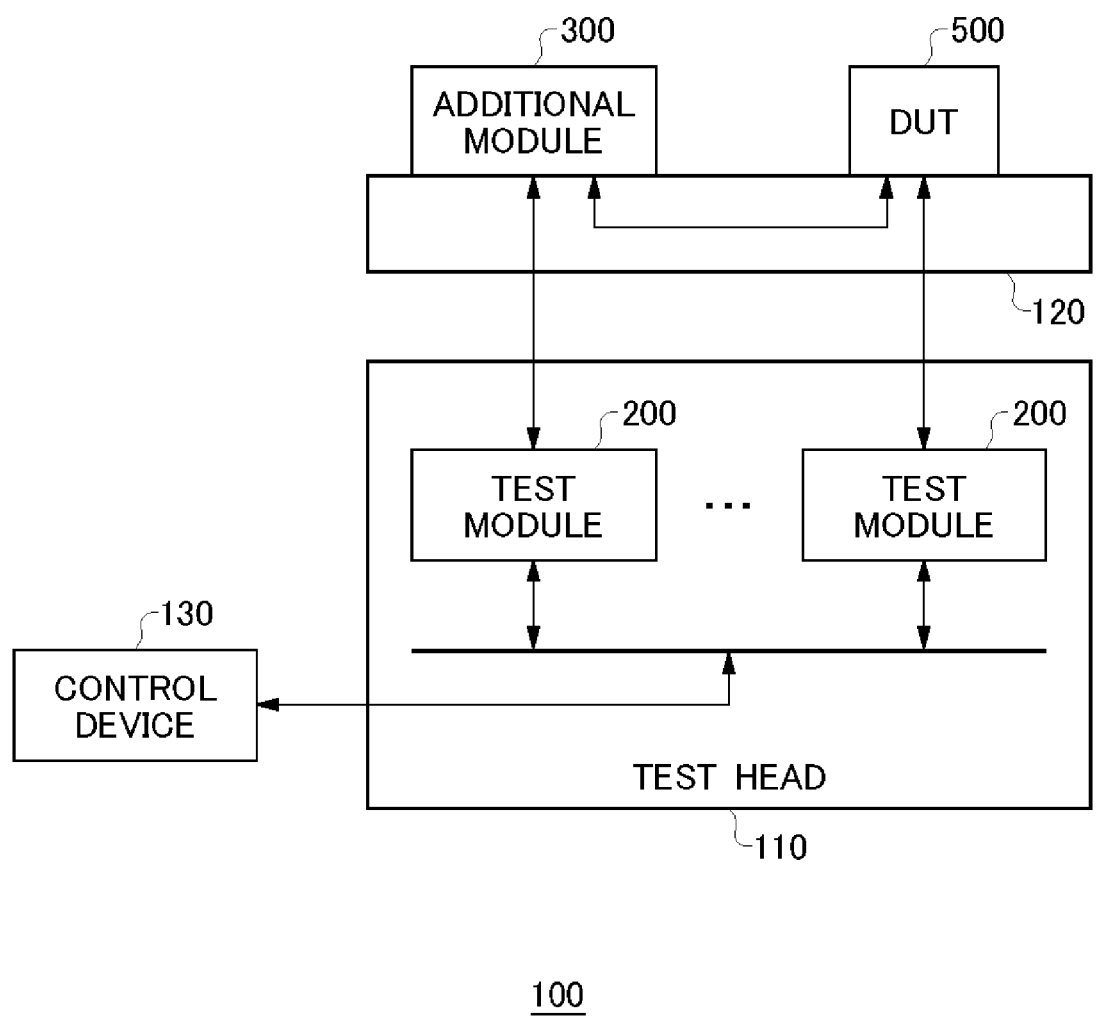
FIG. 1 shows a configuration of a test apparatus 100 according to the present embodiment along with a device under test (DUT) 500.

FIG. 1 shows a configuration of a test apparatus 100 according to the present embodiment along with a device under test (DUT) 500. The test apparatus 100 according to the present embodiment tests the device wider test 500. The test apparatus 100 includes a test head 110, a performance board 120, control device 130 and an additional module 300.

The test head 110 includes thereon one or more test modules 200. Each of one or more test modules 200 executes a test program and communicates signals with the device under test 500 to test the device under test 500. In addition, any of the test modules 200 is connected to the device under test 500 through the additional module 300 to communicate packets with the device under test 500, so that the device under test 500 is tested.

The performance board 120 is mounted on the test head 110. The device under test 500 and the additional module 300 are mounted on the performance board 120. The performance board 120 connects between the test modules 200 and the device under test 500. Moreover, the performance board 120 connects between any of the test modules 200 and the additional module 300, and also connects the additional module 300 and the device under test 500.

The control device 130 controls the test modules 200 and the additional module 300. The control device 130 provides a test program for each of the test modules 200, for example. In addition, the control device 130 performs various settings for the test modules 200 and the additional module 300, for example.

The additional module 300 is mounted on the performance board 120. The additional module 300 is disposed between any of the test modules 200 and the device under test 500.

The additional module 300 then performs at least one communication with the device under test 500, of a communication performed at a higher speed and a communication performed with a lower latency, in comparison with a communication performed by the test modules 200. In this case, the additional module 300 communicates, with the device under test 500, an undefined signal having a data value and a timing, where a test program can not specify the data value transmittal and received and the timing for transmitting and receiving the signal, for example.

The undefined signal may be a signal of which timing for transmitting or receiving data is off dependent on conditions of the device and conditions of communications, for example. In addition, the undefined signal may be a signal by which the same packet is repeatedly transmitted dependent on conditions of the device and conditions of communications, for example.

Then, the additional module 300 communicates with each test module 200 a definite signal of which data value and timing received and transmitted can be previously specified by the test program. The definite signal may be a signal of which timing for transmitting or receiving data is previously defined, for example. In addition, the definite signal may be a signal of which data contents do not change regardless of conditions of the devices and communications, for example.

Such additional module 300 can convert the undefined signal communicated with the device under test 500 to a definite signal and transmit the definite signal to the test modules 200. In addition, the additional module 300 can convert the definite signal communicated with the test modules 200 to an undefined signal and transmit the undefined signal to the device under test 500. Here, the test apparatus 100 may also include another additional module 300 between a functional block that performs communications at a speed less than that of the test modules 200 and with a latency higher than that of the test modules 200 and the test modules 200.

Figure 2:
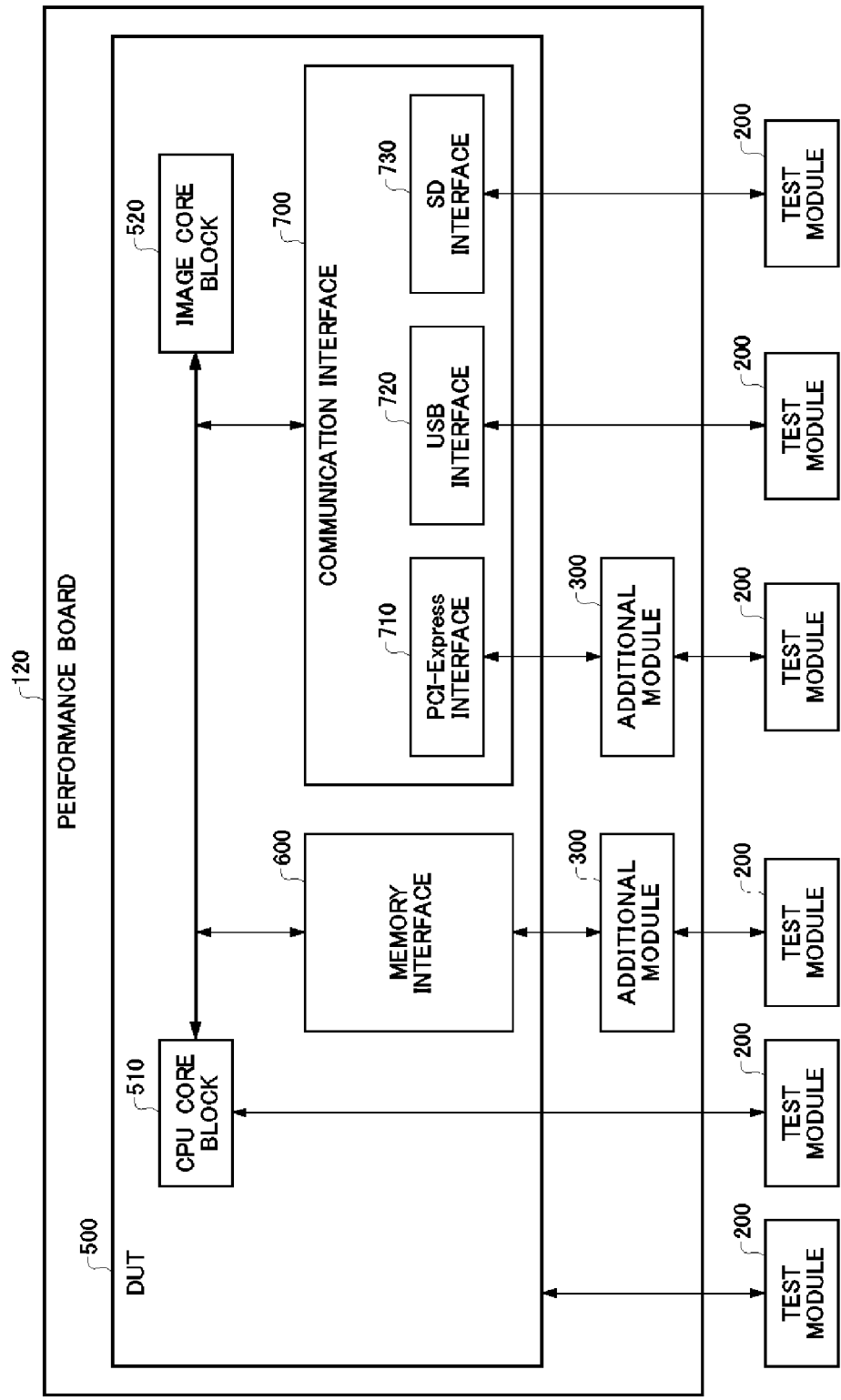
FIG. 2 shows an exemplary configuration of the device under test (DUT) 500 and an exemplary connection state between test modules 200 and additional modules 300 according to the present embodiment.

FIG. 2 shows an exemplary configuration of the device under test (DUT) 500 and an exemplary connection state between test modules 200 and additional modules 300 according to the present embodiment. The device under test 500 includes functional blocks, such as a CPU core block 510, an image core block 520, a memory interface 600 and a communication interface 700, for example. The test apparatus 100 communicates such as packets with each functional block in the device under test 500 to test the device under test 500, for example.

The memory interface 600 is to access an external memory by the device under test 500, such as a DDR-SDRAM (Double Data rate-SDRAM). Here, the memory interface 600 performs communications with the external memory with a latency less than that can be achieved with the test module 200, for example. Here, the test apparatus 100 may include the additional module 300 between the memory interface 600 and the test module 200, for example.

Receiving a delivery request of data from the memory interface 600, the additional module 300 provided between the memory interface 600 and the test module 200 delivers the data to the memory interface 600, instead of the test module 200, for example. The additional module 300 therefore can respond to at least a part of commands among commands supplied from the device under test 500 to the external memory, instead of the test module 200.

The communication interface 700 is an interlace for the device under test 500 to communicate with the external device. The communication interface 700 includes a PCI-Express interface 710 to communicate with the external device in the PCI-Express system, a USB interface 720 to communicate with the external device in the USB system, and a SD interface 730 to communicate with the external device in the SD system, for example.

Among these functional blocks for communications, the PCI-Express interface 710 communicates with the external device at a speed higher than that of communication with the test module 200, for example. Thus, the test apparatus 100 may have the additional module 300 between the PCI-Express interface 710 and the test module 200.

Receiving a packet from the PCI-Express interface 710, the additional module 300 provided between the PCI-Express interface 710 and the test module 200 delivers a response packet to the PCI-Express interlace 710, for example, instead of the test module 200. The additional module 300 therefore can respond to at least a part of packets among packets supplied from the device under test 500 to the external device, instead of the test module 200.

Moreover, in the test apparatus 100, any test module 200 (first test module 200) of the plurality of test modules 200 is directly connected to the device under test 500 to communicate packets with the device under test 500. In addition, in the test apparatus 100, any test module 200 (second test module 200) different from the first test module 200 may be connected to the additional module 300 to control the additional module 300.

Moreover, in the test apparatus 100, the test module 200 may have a plurality of terminals. In this case, at least any one terminal (first terminal) of the plurality of terminals of the test module 200 may be directly connected to the device under test 500 to communicate packets with the device under test 500. Then, at least one terminal (second terminal) different from the first terminal of the test module 200 may be connected to the additional module 300 to control the additional module 300.

Figure 3:
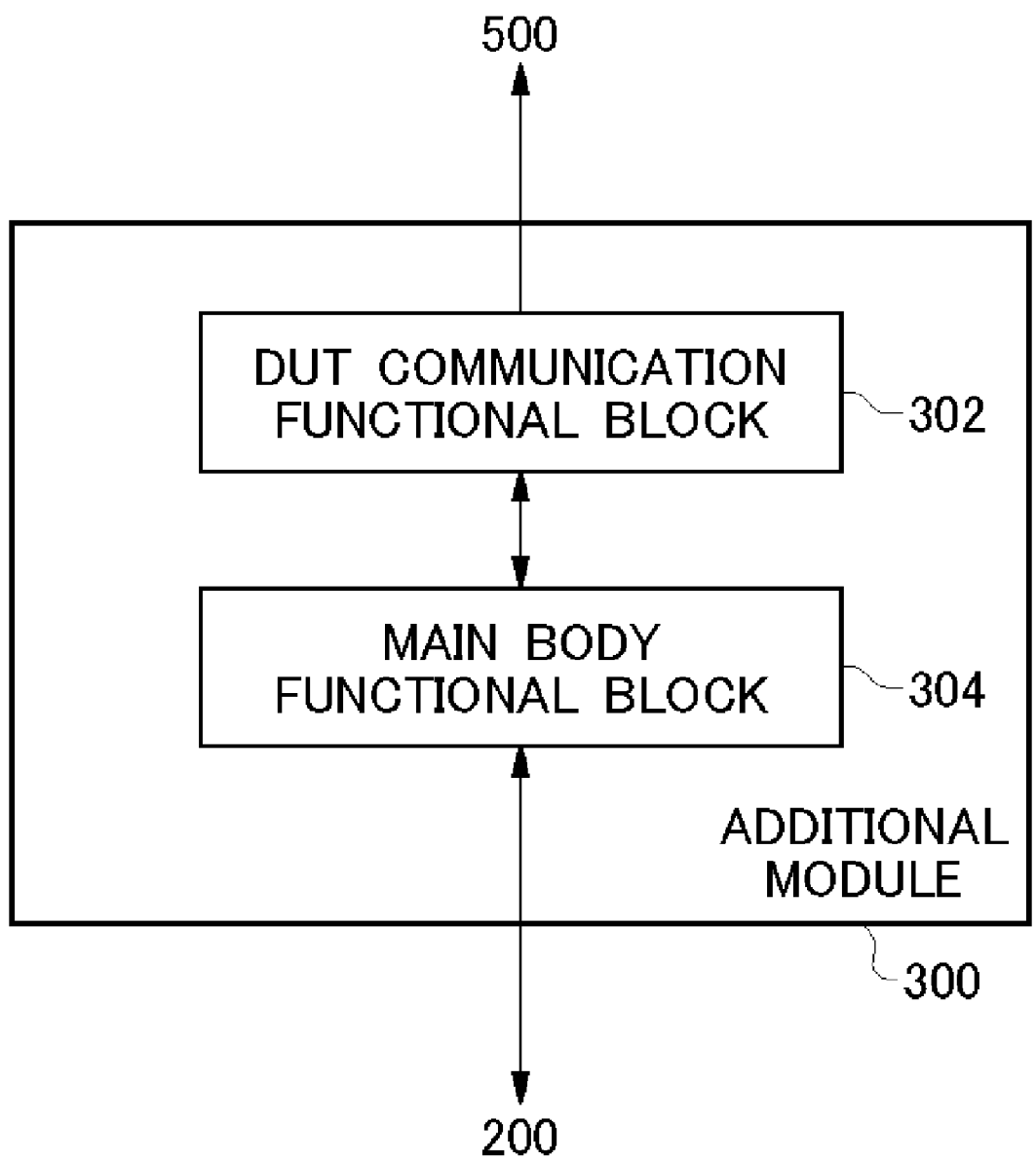
FIG. 3 shows a functional configuration of the additional module 300 according to the present embodiment.

FIG. 3 shows a functional configuration of the additional module 300 according to the present embodiment. The additional module 300 has a DUT communication functional block 302 to communicate with the device under test 500, and a main body communication functional block 304 to communicate with the test module 200.

The DUT communication functional block 302 has a function to receive a request signal from the device under test 500, for example. The function is to receive commands, e.g. memory read command, memory write command output from the memory interface 600 of the device under test 500.

In addition, the DUT communication functional block 302 has a function to interpret the request signal from the device under test 500, for example. The function is to determine contents of the command received by the function for receiving the request signal from the device under test 500. For example, the function is to determine such as memory write command and memory read command.

Moreover, the DUT communication functional block 302 has a function to deliver data prestored on a memory in the additional module 300 to the device under test 500, in response to a request signal from the device under test 500, for example. The function is, when the memory read command is supplied from the device under test 500, to return to the device under test 500 the data prestored on the additional module 300 at an address designated by the command, for example.

In addition, the DUT communication functional block 302 has a function to store data delivered from the device under test 500, for example. The function is, when the memory write command is supplied from the device under test 500, to store the data from the device under test 500 in the additional module 300, for example.

In addition, the DUT communication functional block 302 has a function to directly return, in response to the request signal from the device under test 500, to the device under test 500 the data delivered from the device under test 500 (loopback function). The function is to directly return data supplied from the device under test 500 to the device under test 500, when the memory read command to the same address is supplied after storing the data in response to the memory write command from the device under test 500, for example.

In addition, the DUT communication functional block 302 has a function to process the data supplied from the device under test 500 and return the processed data to the device under test 500, in response to the request signal from the device under test 500, for example. The function is to perform such as bit inversing and a predetermined logical operation on the data supplied from the device under test 500 and return the processed data to the device under test 500, when the memory read command to the same address is supplied after storing the data in response to the memory write command from the device under test 500, for example.

In addition, the DUT communication functional block 302 has a function to receive a clock generated by the device under test 500 and make the clock an operating clock of the additional module 300, for example. The DUT communication functional block 302 has a function to receive a timing reference signal generated by the device under test 500 and cause the additional module 300 to operate, based on the reference signal, for example. The function is to acquire a strobe signal received and transmitted in synchronism with the data between the device under test 500 and DRAM and generate a timing for capturing the data from the device under test 500.

Moreover, the DUT communication functional block 302 has a function to generate a control signal for controlling the device under test 500, for example. For example, the function is to supply addresses and commands to device under test 500.

The main body communication functional block 304 has a function to program the function of the additional module 300 from the test module 200 side, for example. The function is to receive a program code from the test module 200 and control the additional module 300, according to the program code.

In addition, the main body communication functional block 304 has a function to set data to be stored on the additional module 300 from the test module 200 side, for example. The function is to previously receive, from the test module 200, the data to be returned from the additional module 300 to the device under test 500, when the memory read command is supplied from the device under test 500.

In addition, the main body communication functional block 304 has a function to read out the data stored on the additional module 300 from the test module 200 side. The function is to transmit to the test module 200 the data stored in the additional module 300, when the write command is supplied from the device under test 500.

In addition, the main body communication functional block 304 has a function to store in time series manner what request and data are received from the device under test 500 thereto (log function), for example. The function is to store in time series manner the commands and data supplied from the device under test 500, for example.

In addition, the main body communication functional block 304 has a function to read out a stored log from the test module 200 side, for example. The function is to transmit the commands and data stored in time series manner, in response to a request from the test module 200, for example.

Here, the additional module 300 may not have all the functions described above. In addition, the additional module 300 may be configured by combining some of the above described functions.

Figure 4:
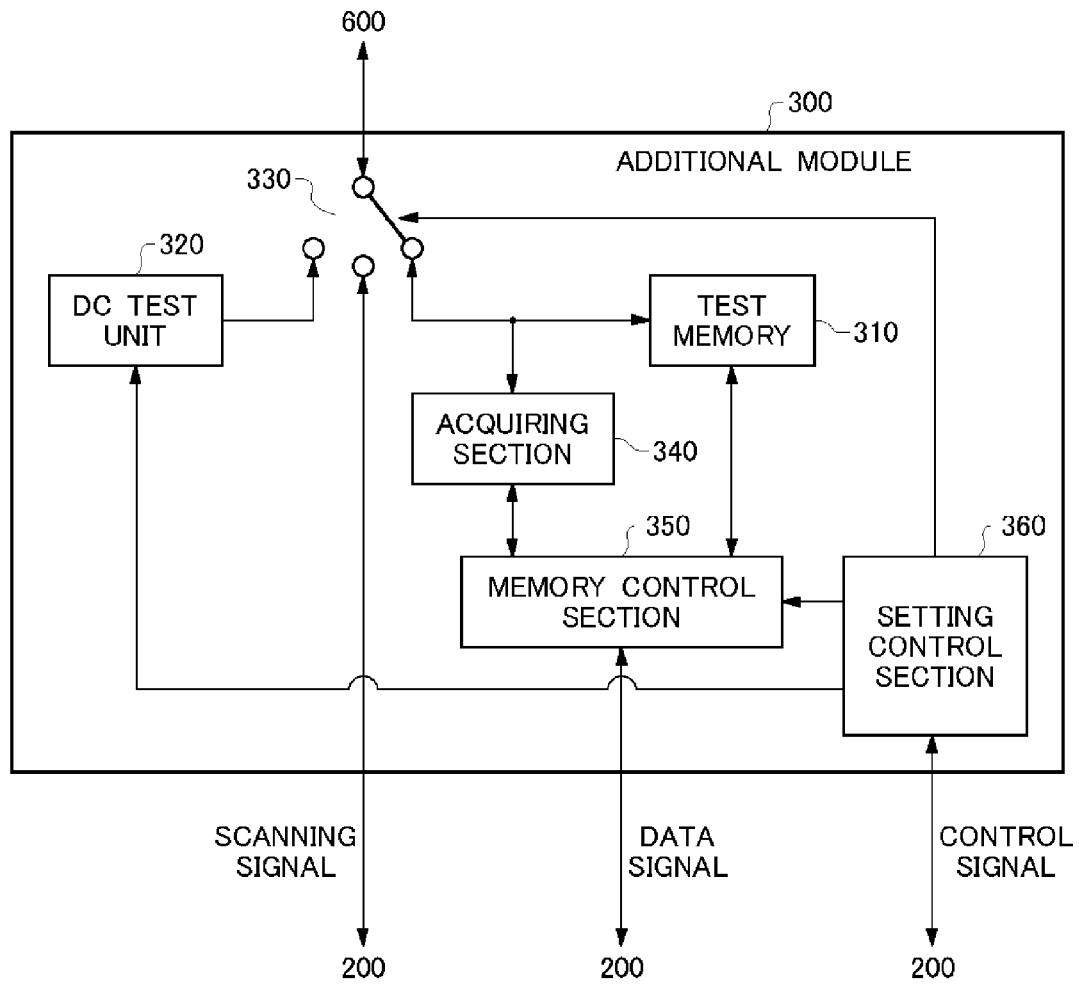
FIG. 4 shows an exemplary more specific configuration of the additional module 300 disposed between a memory interface 600 and the test modules 200.

FIG. 4 shows an exemplary more specific configuration of the additional module 300 provided between the memory interface 600 and the test modules 200. The additional module 300 connected to the memory interface 600 has a test memory 310, a DC test unit 320, a switching section 330, an acquiring section 340, a memory control section 350 and a setting control section 360, for example.

The test memory 310 receives a memory access from the memory interface 600 by the device under test 500 and transmits/receives data to/from the device under test 500, according to the memory access. The direct-current unit 320 generates a voltage and a current to perform a direct-current test on the device under test 500.

The switching section 330 switches among the test memory 310, the DC test unit 320 and the test module 200 to which the memory interface 600 is connected. Here, the switching section 330 connects a terminal for the test of the device under test 500 to the memory interface 600, when the memory interlace 600 is connected to the test module 200, for example. The switching section 330 connects to the memory interface 600 the terminal of the test module 200 that transmits/receives a scanning signal for performing a scanning test on the device under test 500, for example.

The acquiring section 340 acquires a signal transmitted between the memory interface 600 and the test memory 310. The acquiring section 340 acquires in time series manner what command and data are received from the device under test 500, and stores it, for example.

The memory control section 350 accesses the test memory 310 under the control of the test module 200. In addition, the memory control section 350 transmits the signal acquired by the acquiring section 340 to the test module 200 under the control of the test module 200. The setting control section 360 controls a switching position of the switching section 330 in response to a setting by the test module 200. Moreover, the setting control section 360 controls each sections, such as the DC test unit 320 and the memory control section 350 within the additional module 300, in response to a setting by the test module 200.

Such additional module 300 can store the data supplied from the device under test 500 in the additional module 300, when the memory write command is supplied from the device under test 500. In addition, when the memory read command is supplied from the device under test 500, the additional module 300 can return to the device under test 500 the data stored at an address designated by the memory read command.

In addition, the additional module 300 can directly return to the device under test 500 the data supplied from the device under test 500, when the memory read command to the same address is supplied after storing the data in response to the memory write command from the device under test 500. In addition, the additional module 300 can transmit to the test module 200 a log indicative of what request and data are received from the device under test 500.

In addition, the additional module 300 can directly connect a terminal of the test module 200 that tests the device under test 500 to the memory interface 600. The additional module 300 therefore can form a path through which a scanning signal is communicated between the test module 200 and the device under test 500, when a scanning test is performed on the device under test 500.

More over, the additional module 300 can connect the DC test unit 320 to the memory interface 600. The additional module 300 therefore can perform a direct-current test on the device under test 500 through the memory interface 600.

Figure 5:
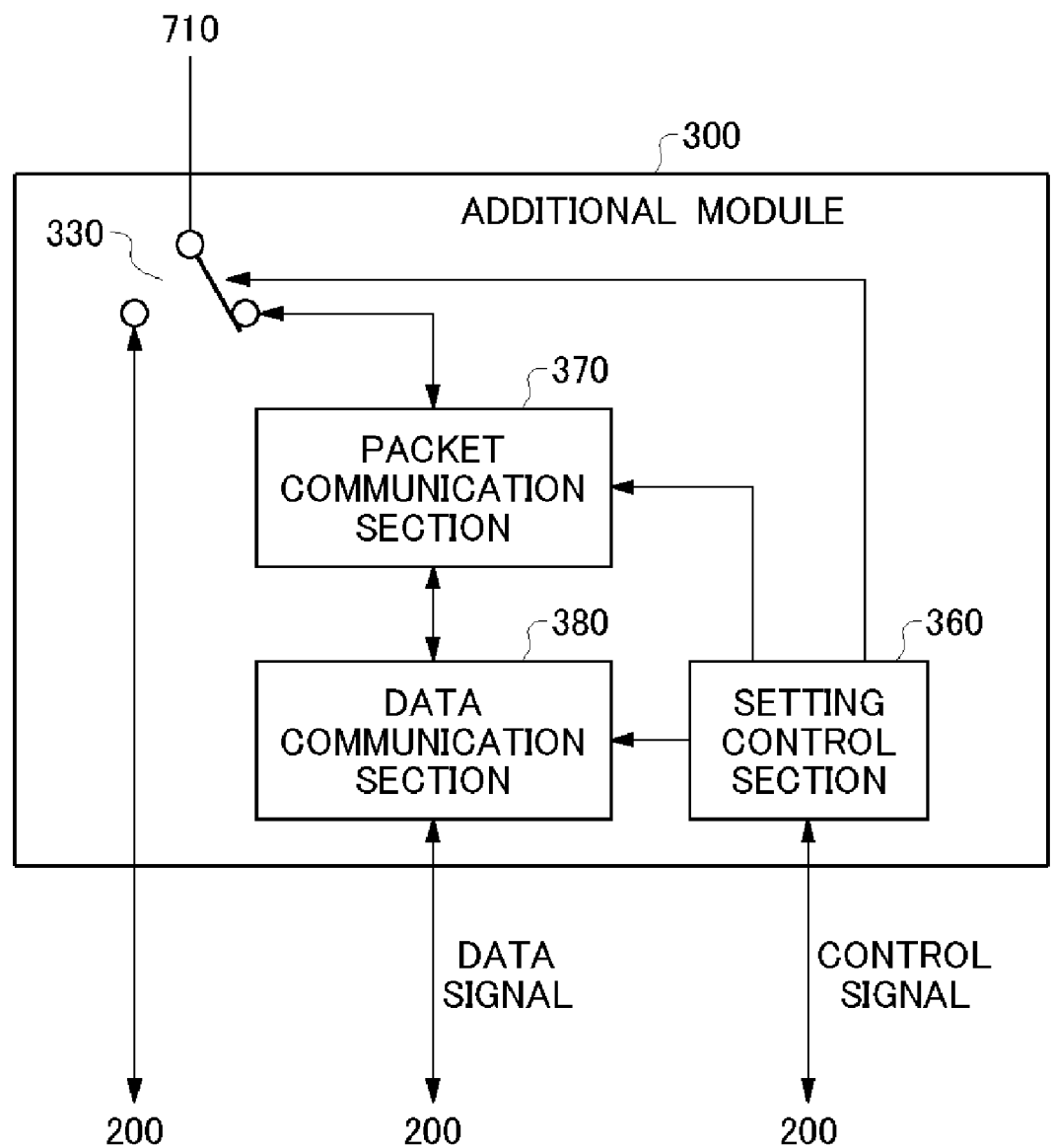
FIG. 5 shows an exemplary more specific configuration of the additional module 300 disposed between a PCI-Express interface 710 and the test modules 200.

FIG. 5 shows an exemplary more specific configuration of the additional module 300 provided between the PCI-Express interface 710 and the test modules 200. The additional module 300 connected to the PCI-Express interface 710 has a switching section 330, a setting control section 360, a packet communication section 370 and a data communication section 380, for example.

The packet communication section 370 communicates packets with the device under test 500. The data communication section 380 transmits and receives data contained in the packets to/from the test module 200. The packet communication section 370 generates a packet according to the data supplied from the test module 200, and transmits the generated packet to the PCI-Express interface 710. In addition, the data communication section 380 generates data according to the packet received from the PCI-Express interface 710, and transmits the generated data to the test module 200.

The switching section 330 switches whether a terminal of the PCI-Express interlace 710 of the test module 200 is connected to the terminal for testing the device under test 500, and whether the packet communication section 370 is connected to the device under test 500. The setting control section 360 controls a switching position of the switching section 330, in accordance with a setting by the test module 200. Moreover, the setting control section 360 controls each section, such as the packet communication section 370 and the data communication section 380 within the additional module 300, in response to the setting by the test module 200.

In the additional module 300, the packet communication section 370 performs processes accommodating adjustment of the receiving timing and retransmission of the packet even if the device under test 500 transmits signals with different receiving timings and retransmits the packet, for example. In the additional module 300, therefore the packet communication section 370 can accommodate undefined communications in the packet communication and communicate definitely the signals with the test module 200.

Figure 6:
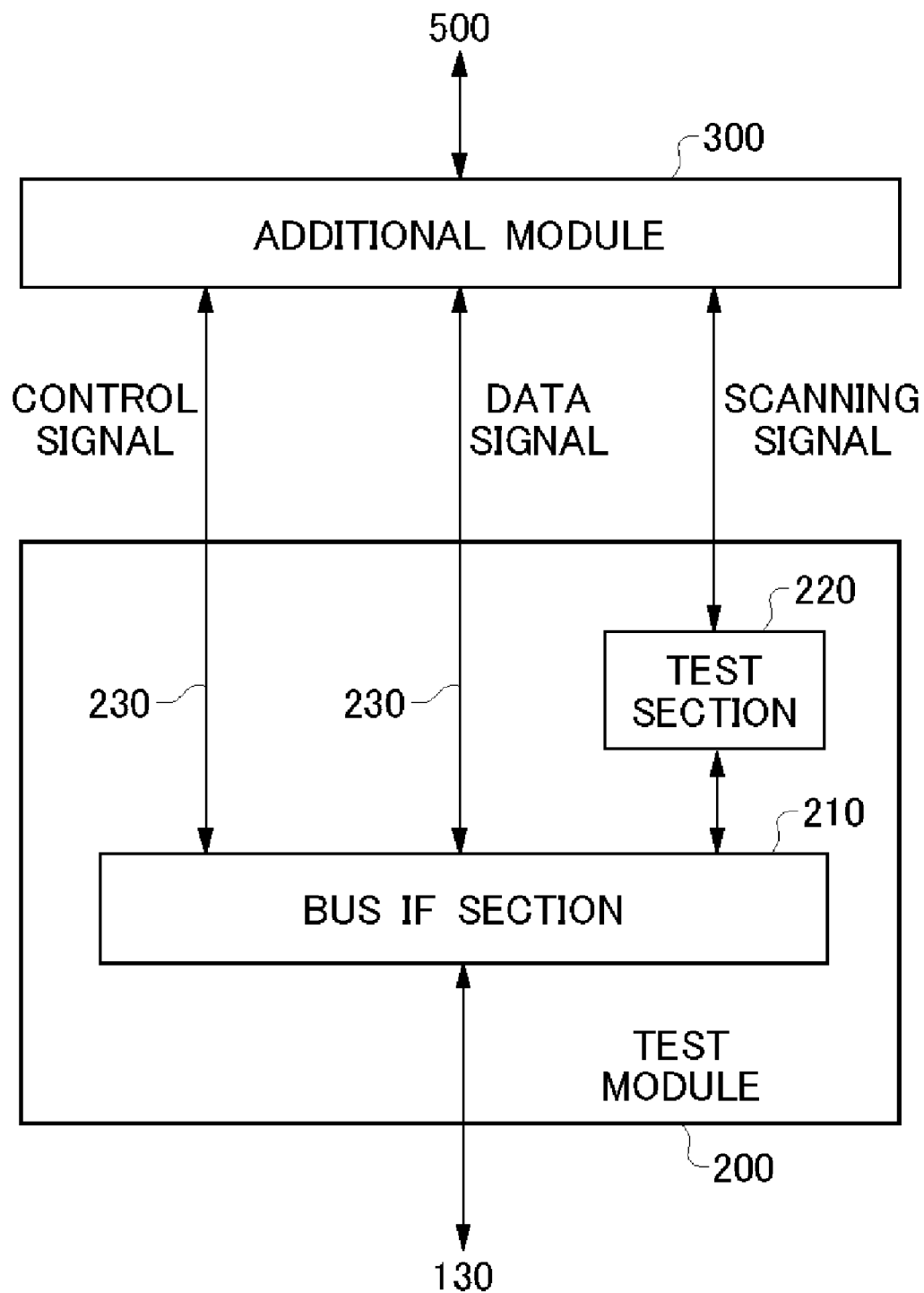
FIG. 6 shows a first exemplary configuration of the test module 200 controlling the additional module 300 according to the present embodiment.

FIG. 6 shows a first exemplary configuration of the test module 200 that controls the additional module 300 according to the present embodiment. The test module 200 that controls the additional module 300 includes a bus IF section 210 and a test section 220, for example. The bus IF section 210 controls to transmit/receive data between the test module 200 and the control device 130.

The test section 220 includes a storing section to store a test program supplied from the control section 130, and a sequencer to execute the test program, for example. The test section 220 performs the test program in accordance with an access request from the control device 130, and generates a test signal to test the device under test 500. Then, the test module 200 outputs the generated test signal from a terminal for testing the device under test 500 to the additional module 300. The test section 220 according to the first exemplary configuration generates a scanning signal for performing a scanning test on the device under test 500.

In addition, the test module 200 according to the first exemplary configuration has a path 230 to forward to the additional module 300 the access request from the control device 130 of the test apparatus 100 to the additional module 300. The path 230 forwards a control signal including the access request to a register within the additional module 300 from the control device 130, and a data signal including a program and data supplied from the control device 130, for testing the device under test 500, for example.

In such test module 200 according to the first exemplary configuration, the control device 130 can access the additional module 300, as a part of components in the test module 200. In addition, the test module 200 according to the first exemplary configuration, a scanning signal generated by the test section 220 can be supplied to the device under test 500, when the device under test 500 is subjected to the scanning test.

Figure 7:
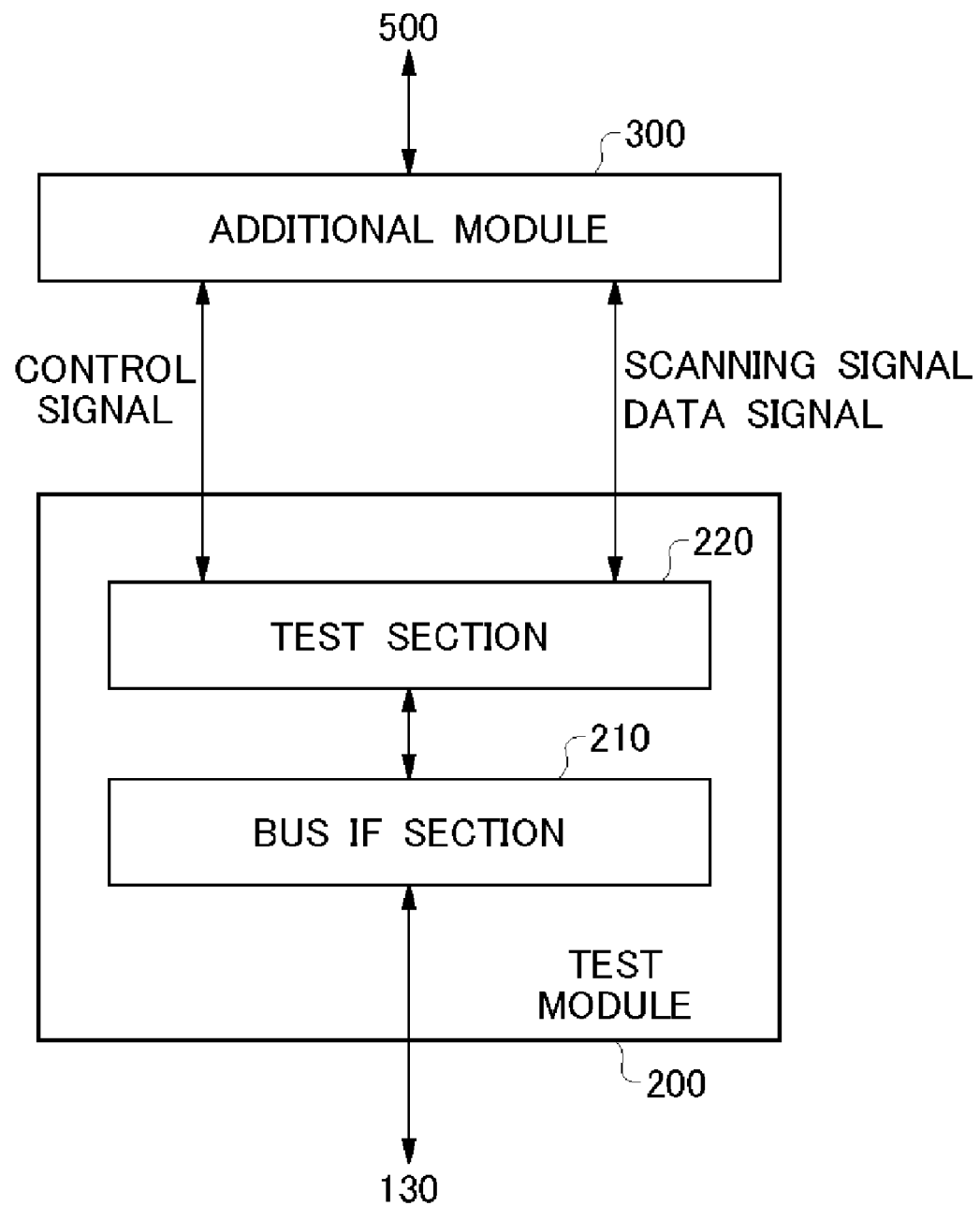
FIG. 7 shows a second exemplary configuration of the test module 200 controlling the additional module 300 according to the present embodiment.

FIG. 7 shows a second exemplary configuration of the test module 200 that controls the additional module 300 according to the present embodiment. Here, among the functional blocks included in the test module 200 according to the second exemplary configuration, any functional blocks substantially the same as those of the test module 200 according to the first exemplary configuration of the test module 200 have the same reference numerals, and the description is omitted except for differences during description of FIG. 7.

The test section 220 according to the second exemplary configuration performs the test program, and generates a scanning signal, a data signal and a control signal. The test module 200 outputs the scanning signal and the data signal from a terminal for testing the device under test 500 to the additional module 300. In addition, the test module 200 outputs the control signal from a terminal for controlling the additional module 300 to the additional module 300.

Such test section 220 can switch the test programs to be executed in accordance with the control of the control device 130. The test section 220 generates a scanning signal when the device under test 500 is subjected to the scanning test.

In addition, the test section 220 generates a data signal and a control signal supplied to the additional module 300, when the device under test 500 is tested through the additional module 300. Such test module 200 can control the additional module 300 through the terminal for testing the device under test 500.

Figure 8:
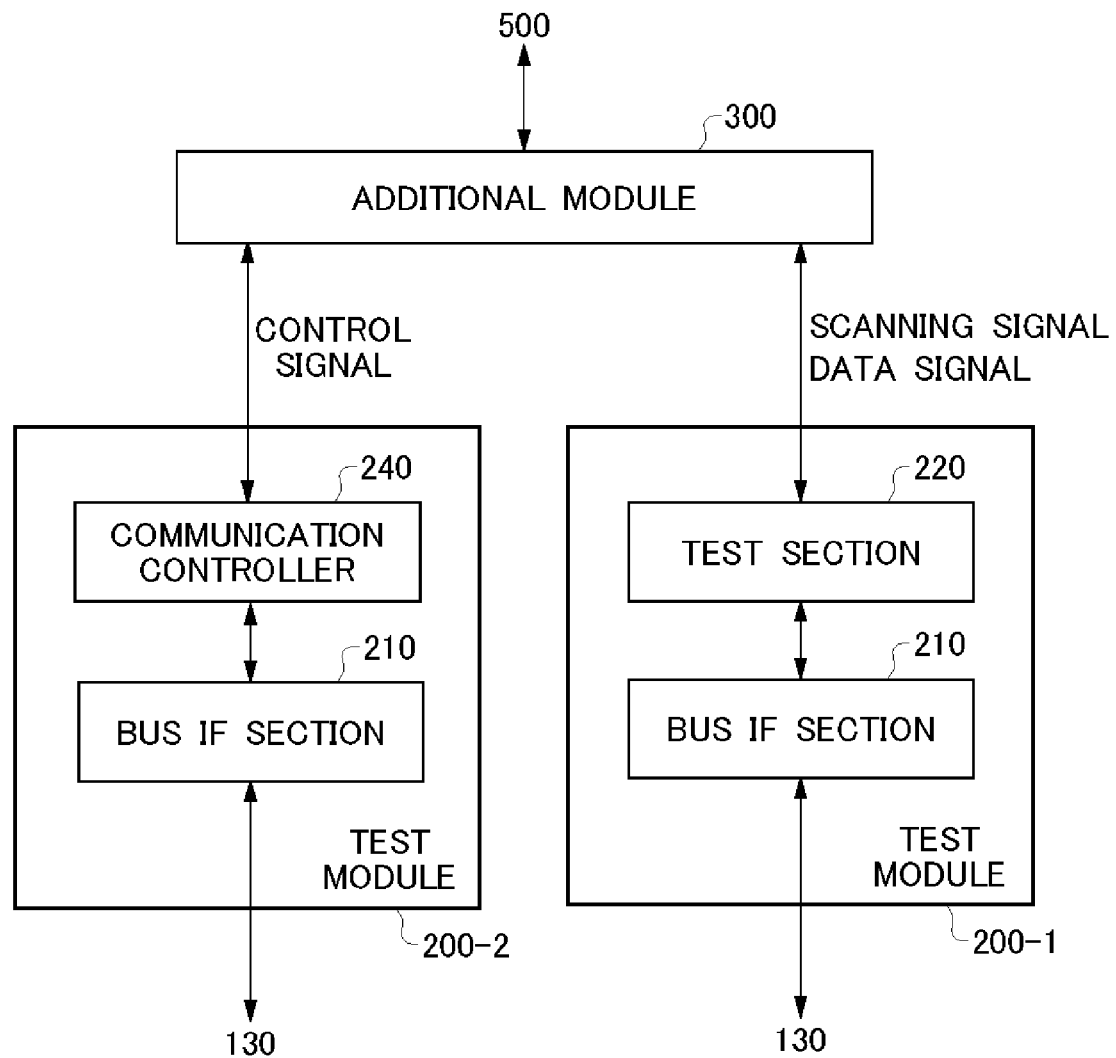
FIG. 8 shows a third exemplary configuration of the test module 200 controlling the additional module 300 according to the present embodiment.

FIG. 8 shows a third exemplary configuration of the test modules 200 that controls the additional module 300 according to the present embodiment. Here, among the functional blocks included in the test modules 200 according to the third exemplary configuration, any functional blocks substantially the same as those of the test module 200 according to the first exemplary configuration of the test module 200 have the same reference numerals, and the description is omitted except for differences during description of FIG. 8.

The additional module 300 in the third exemplary configuration is connected to a first test module 200-1 and a second test module 200-2. The first test module 200-1 has a bus IF section 210 and a test section 220. The test section 220 included in the first test module 200-1 executes the test program to generate a scanning signal and a control signal.

The test section 220 included in the first test module 200-1 generates a scanning signal and outputs the scanning signal from a terminal for testing the device under test 500 to the additional module 300, when the device under test 500 is subjected to the scanning test. Meanwhile, the test section 220 included in the first test module 200-1 generates a data signal supplied to the additional module 300 and outputs the data signal from a terminal for testing the device under test 500 to the additional module 300, when the test device 500 is tested through the additional module 300.

A second test module 200-2 includes a bus IF section 210 and a communication controller 240. The communication controller 240 controls to transmit/receive data through a predetermined communication interface to/from the additional module 300. The communication controller 240 transmits and receives data through such as I2C (Inter-Integrated Circuit) and SPI (Serial Peripheral Interface), for example.

When the device under test 500 is tested through the additional module 300, the communication controller 240 included in the second test module 200-2 supplies an access request to the additional module 300, which is received from the control device 130, to the additional module 300 through a predetermined communication interface. Such second test module 200-2 can control the additional module 300 through the communication interface.

Figure 9:
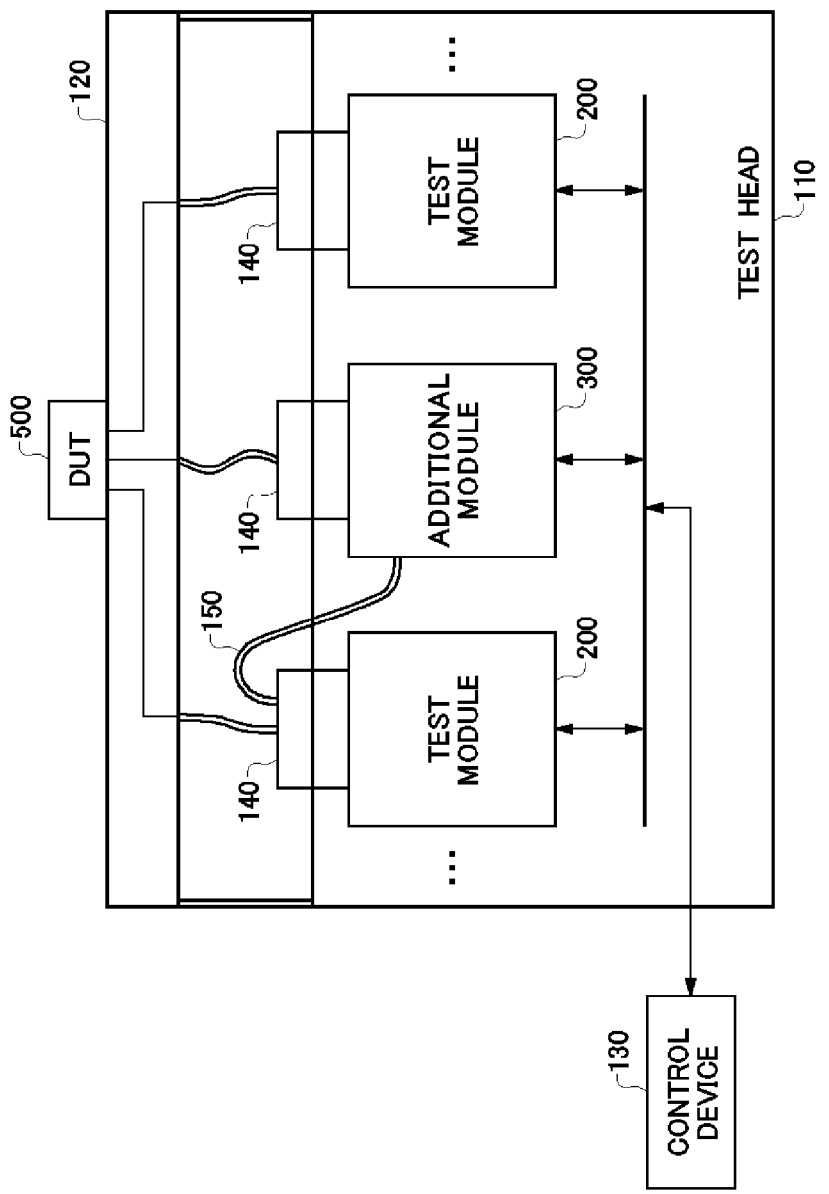
FIG. 9 shows a configuration of the test apparatus 100 according to a modification of the present embodiment along with the device under test (DUT) 500.

FIG. 9 shows a configuration of the test apparatus 100 according to a modification of the present embodiment, along with the device under test (DUT) 500. The test apparatus 100 according to the modification has the same features and functions as those of the test apparatus 100 according to the present embodiment with reference to FIGS. 1-8, so components having the same configuration and function as those of the components as shown in FIGS. 1-8 have the same reference numerals as those as shown in FIG. 1-8, and the description is omitted except for differences.

The test head 110 according to the modification has a plurality of connectors 140 which connect the test modules 200 and the additional module 300, respectively.

The test modules 200 and the additional module 300 connected to the plurality of connectors 140, respectively are mounted on the test head 110. The device under test 500 is mounted on the performance board 120. The performance board 120 is mounted on the test head 110, and connects between at least a part of terminals of the plurality of connectors 140 and the device under test 500. Here in the modification, the additional module 300 is not mounted on the performance board 120.

Here, any of the test modules 200 mounted on the test head 110 is connected to the device under test 500 through the additional module 300. In this case, the test module 200 is connected to the additional module 300 through such as a cable 150, without through the performance board 120 but.

For example, the plurality of connectors 140 with the same specification which connect at least one of the test modules 200 and at least one of the additional modules 300 are arranged on the test head 110. Moreover, the test module 200 and the additional module 300 which are connected to one another are connected to two connectors 140 adjacent to one another among the plurality of connectors 140, for example.

Then, the test module 200 is connected to the additional module 300 through at least one terminal of the connector 140 of the test head 110, which connects the test module 200, for example. The test module 200 therefore can be connected to the additional module 300 through the cable 150 in the test head 110.

Thus, in the test apparatus 100 according to the modification, a device under test 500 that transmits and receives undefined signals can be tested. Additionally, in the test apparatus 100 according to the modification, since die additional module 300 can be mounted on the hest head 110 as well as the test modules 200, the additional module 300 can be easily fabricated and attached/detached.

Figure 10:
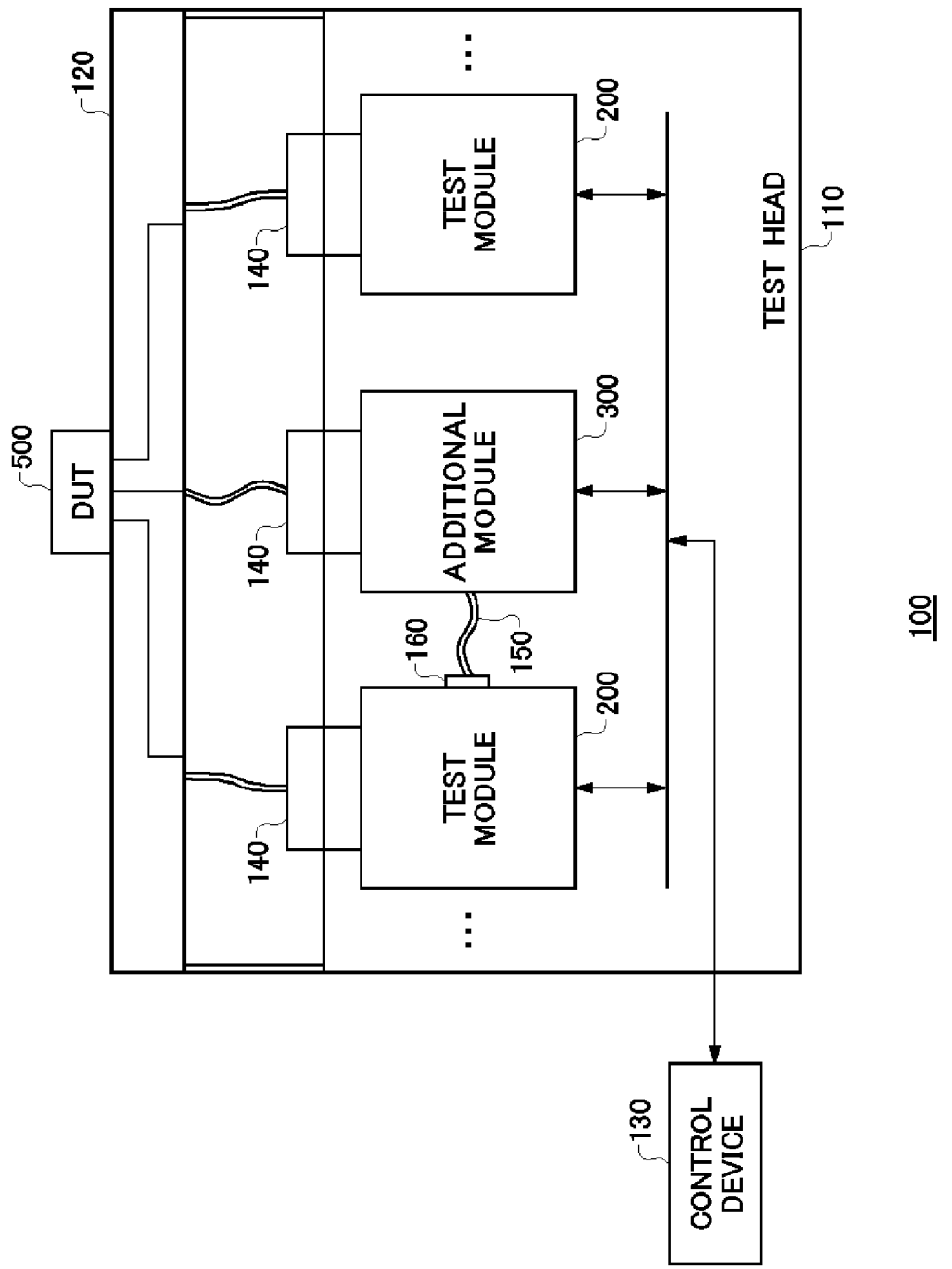
FIG. 10 shows a configuration of the test apparatus 100 according to a modification of the present embodiment along with the device under test (DUT) 500, when the test module 200 and the additional module 300 is connected without through the connector 140 of the test head 110.

FIG. 10 shows a configuration of the test apparatus 100 according to a modification along with the device under test (DUT) 500, when the test modules 200 and the additional module 300 are connected without through the connectors 140 of the test head 110. The test module 200 may be connected to the additional module 300 without through the connector 140 of the test head 110, for example.

For example, the test module 200 has a terminal 160 for connecting the test module 200 to the additional module 300 without through the connector 140. Then, the test module 200 communicates with the additional module 300 through the cable 150 which is connected to a terminal 160. Also in such test apparatus 100, the additional module 300 can be easily fabricated and attached/detached.

Figure 11:
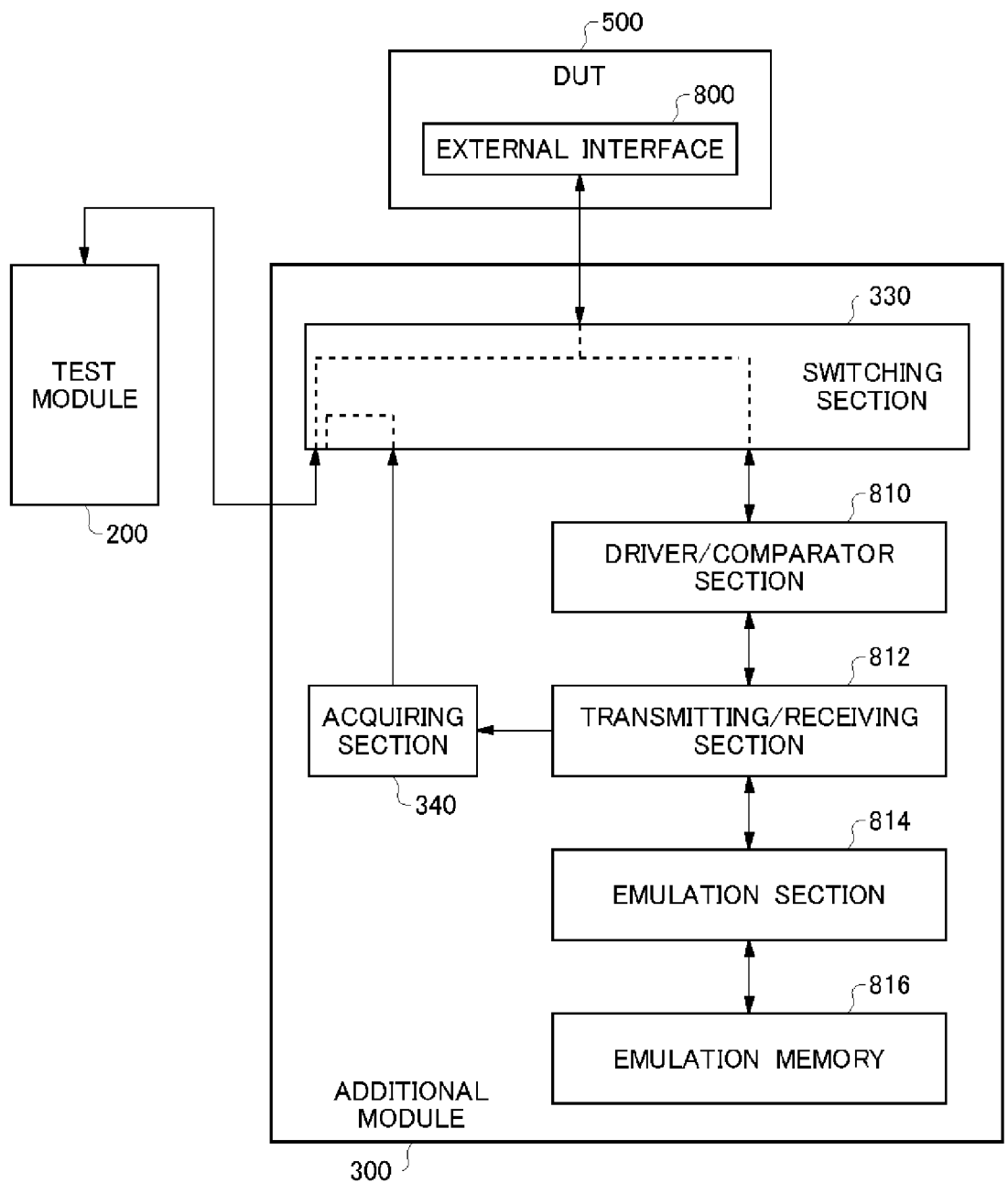
FIG. 11 shows an exemplary more specific configuration of the additional module 300 disposed between an external interface 800 in the device under test 500 and the test module 200.

FIG. 11 shows an exemplary configuration of the additional module 300 provided between die device under test 500 and the test module 200. The additional module 300 is connected to an external interface 800 included in the device under test 500. The external interface 800 is an interface for the device under test 500 to communicate data with die external device, e.g. a memory, such as a DDR-SDRAM. The external interface 800 may be the memory interface 600 and die PCI-Express interface 710, for example.

The additional module 300 has a driver/comparator section 810, a transmitting/receiving section 812, an emulation section 814, a memory for emulation 816, a switching section 330 and an acquiring section 340.

Receiving a data signal output from die device under test 500 (at a reception time), the driver/comparator section 810 compares the data signal output from the external interlace 800 of die device under test 500 with a threshold, and outputs a logic signal indicative of a logical value of die data signal. In addition, transmitting the data signal to the device under test 500 (at a transmission time), the driver/comparator section 810 receives the logic signal from the transmitting/receiving section 812, and outputs a signal of a voltage corresponding to the received logic signal to the external interface 800 of the device under test 500.

At the reception time, the transmitting/receiving section 812 acquires the logical value of the logic signal output from the driver/comparator section 810 at the timing of the data signal output from the device under test 500. When a clock signal is transmitted from the device under test 500 in parallel with the data signal, the transmitting/receiving section 812 acquires the logical value at the timing of the clock signal, for example. In addition, when the data signal in which the clock signal is embedded (clock embedded signal) is output from the device under test 500, the transmitting/receiving section 812 reproduces the clock signal from the data signal output from the device under test 500, and acquires the logical value at the timing of the reproduced clock signal, for example.

That is, the transmitting/receiving section 812 receives the logical value of the data signal output from the device under test 500, at the timing designated by the clock signal transmitted from the device under test 500. The additional module 300 therefore can receive an undefined signal output from the device under test 500.

In addition, at the transmission time, the transmitting/receiving section 812 outputs the logic signal generated by the emulation section 814 to the driver/comparator section 810 at the timing of a predetermined clock.

The emulation section 814 emulates an external device connected to the external interface 800 of the device under test 500. The emulation section 814 generates a data signal transmitted by the external device which received the data signal from the device under test 500 to the device under test 500, based on the logic signal acquired by the transmitting/receiving section 812, for example. The memory section for emulation 816 stores data referred by the emulation section 814 in emulating.

The switching section 330 switches between the emulation section 814 and the test module 200 to which the external device 800 of the device under test 500 is connected. When the external device 800 of the device under test 500 is connected to the emulation section 814, the switching section 330 connects between the external device 800 and the driver/comparator section 810, and disconnects between the external interface 800 and the test module 200. Meanwhile, when the external interface 800 of the device under test 500 is connected to the test module 200, the switching section 330 connects between the external interface 800 and the test module 200 and disconnects between the external interface 800 and the driver/comparator section 810.

Here, when the external interface 800 of the device under test 500 is connected to the test module 200, the switching section 330 receives the data signal transmitted from the device under test 500 at the timing designated by the clock of the test apparatus 100. The test module 200 therefore can receive the data signal transmitted from the device under test 500.

When the external interface 800 is connected to the test module 200 to communicate the data signal between the test module 200 and the device under test 500, the test module 200 reduces the frequency of the clock supplied to the device under test 500, in comparison with a case in which the external interface 800 is connected to the emulation section 814 to communicate the data signal between the emulation section 814 and the device under test 500, for example. The test module 200 therefore can consistently communicate with the device under test 500 even if a delay is generated because the transmission path between the device under test 500 and the test module 200 is long.

The acquiring section 340 acquires the data signal communicated between the device under test 500 and the emulation section 814 and stores the acquired data. The acquiring section 340 acquires and stores, in time series manner, what commands and data are transmitted/received between the device under test 500 and the emulation section 814, for example. Then, the acquiring section 340 transmits the acquired data to the test module 200 at the timing designated by the clock of the test apparatus 100, in response to an access from the test module 200. The additional module 300 therefore can transmit to the test module 200 the contents of the undefined communication between the device under test 500 and the additional module 300.

Even if testing the device under test 500 that communicates an undefined signal with the external device, the test apparatus 100 as described above can consistently test the device under test 500 because the emulation section 814 of the additional module 300 emulates the external device. Moreover, even if testing the device under test 500 that performs a handshake with the external device with a low latency, the test apparatus 100 as described above can consistently test the device under test 500.

Here, the device under test 500 may set a latency of the data communication with the external device to lower than that for the general operation at the testing time. When the device under test 500 is mounted into the test head 110, the test module 200 may set the device under test 500 in a mode such that the device under test 500 operate with a low latency. Thereby the additional module 300 can consistently perform a test even if a delay larger than that in the normal operation occurs in communications between the device under test 500 and the additional module 300.

Figure 12:
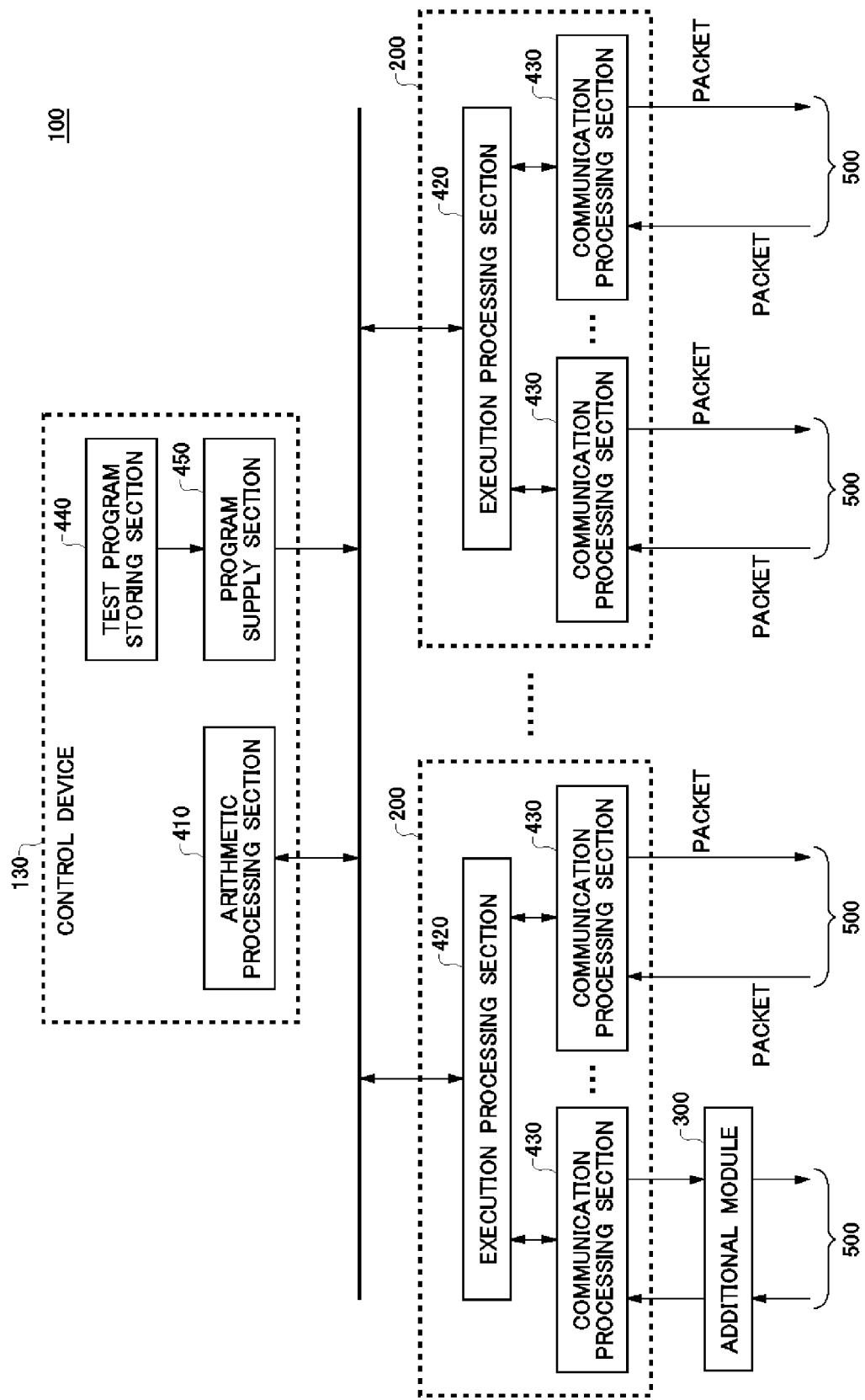
FIG. 12 shows an exemplary configuration of the test apparatus 100 according to the present embodiment.

FIG. 12 shows an exemplary configuration of the test apparatus 100 according to the present embodiment. The test apparatus 100 executes a test program to test at least one device under test 500.

The control device 130 has an arithmetic processing section 410, a test program storing section 440 and a program supply section 450. Each of the plurality of test modules 200 has an execution processing section 420 and one or more communication processing sections 430.

The additional module 300 is connected to any of one or more communication processing sections 430 of either the test modules 200. Here, the additional module 300 has a part of functions within the communication processing section 430 connected thereto.

The additional module 300 may has, instead of the packet communication section 434, a transmitting section 36 and a receiving section 82 in the packet communication section 434, which are described in detail with reference to FIG. 14, for example. In addition, the additional module 300 may has, instead of the packet communication section 434, a packet command sequence storing section 24, a packet data sequence storing section 26, a lower sequencer 28, a data processing section 32, a data converting section 34, a transmitting section 36 and a receiving section 82 in the packet communication section 434.

Each of the execution processing section 420 can be connected to the arithmetic processing section 410 through such as a bus. Each of the communication processing section 430 is connected to any of the execution processing sections 420.

The arithmetic processing section 410 processes arithmetic expressions in the test program. Each of the execution processing sections 420 designates a packet list, among a plurality of packet lists in the test program, which is to be executed by each communication processing section 430 connected to the execution processing section 420. Each communication processing section 430 sequentially communicates with the corresponding device under test 500 the packets included in the packet list designated by the corresponding execution processing section 420.

The test apparatus 100 may include one arithmetic processing section 410, 8 execution processing sections 420 and 256 communication processing sections 430, for example. In this case, 32 communication processing sections 430 are connected to each of 8 execution processing sections 420, for example. However, the connection of the test apparatus 100 is not limited in this regards and any other connection may be considered.

The test program storing section 440 stores the test program. Before performing a test, the program supply section 450 loads the test program into the arithmetic processing section 410, the execution processing sections 420 and the communication processing sections 430.

Figure 13:
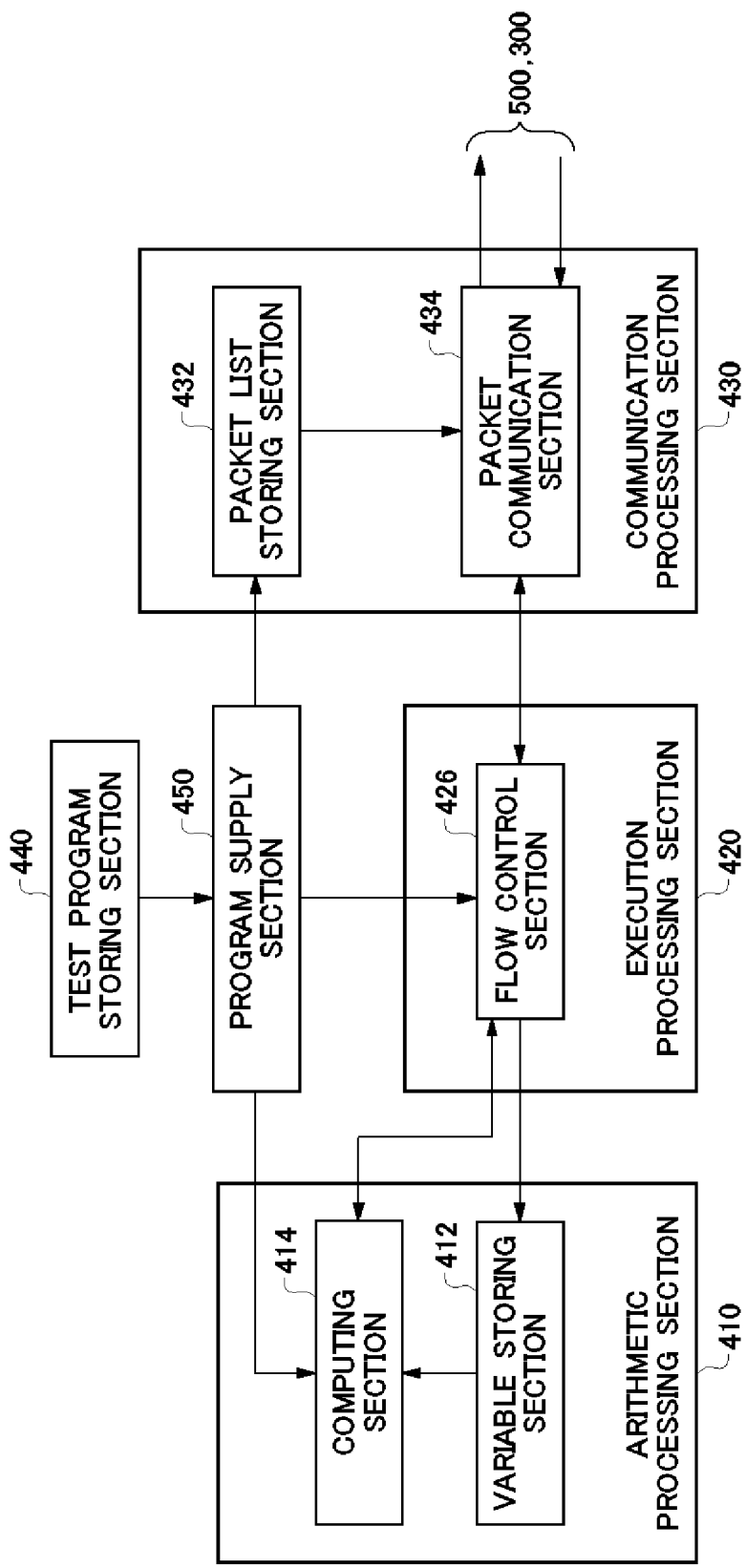
FIG. 13 shows an exemplary configuration of an arithmetic processing section 410, and a representative execution processing section 420 and a representative communication processing section 430 among a plurality of execution processing sections 420 and a plurality of communication processing sections 430.

FIG. 13 shows an exemplary configuration of an arithmetic processing section 410, and a representative execution processing section 420 and a representative communication processing section 430 among a plurality of execution processing sections 420 and a plurality of communication processing sections 430. The arithmetic processing section 410 has a variable storing section 412 and a computing section 414. Each of the execution processing sections 420 has a flow control section 426. Each of the communication processing section 430 has a packet list storing section 432 and a packet communication section 434. Here, although the packet list storing section 432 is provided outside the packet communication section 434 as shown in the figure, it may be provided inside the packet communication section 434.

The program supply section 450 extracts a plurality of packet lists, each of which includes a series of packets in the test program stored in the test program storing section 440 and which is transmitted from the corresponding communication processing section 430, and stores the extracted packet lists on the packet list storing section 432 in the corresponding communication processing section 430. In addition, the program supply section 450 generates a control program in which a control flow sequentially executing the plurality of packet lists which have been extracted from the test program is described, and supplies the control program to the flow control section 426. Moreover, the program supply section 450 generates an arithmetic program executing the arithmetic expressions extracted from the test program, and supplies the extracted arithmetic expressions to the computing section 414.

The flow control section 426 instructs the packet communication section 434 in the corresponding communication processing section 430 about the order for executing each of the plurality of packet lists. More specifically, the flow control section 426 executes the control program supplied from the program supply section 450 and specifies, for the packet communication section 434 in the corresponding communication processing section 430, the packet list to be executed next among the plurality of packet lists stored in the packet list storing section 432. The flow control section 426 transmits the address of the packet list to be executed next, in the packet list storing section 432 to the packet communication section 434, for example.

When any arithmetic expression is included in the control program, the flow control section 426 calls an arithmetic program executing the arithmetic expression and causes the computing section 414 in the arithmetic processing section 410 to execute the arithmetic program. Then, the flow control section 426 specifies a packet list to be executed next, based on the result obtained by computing the arithmetic expression by the arithmetic processing section 410. In this case, the flow control section 426 may wait to specify the next packet list until receiving the result of operation by the arithmetic processing section 410, and select the packet to be specified, according to the result of operation.

The packet list storing section 432 stores a plurality of packet lists supplied from the program supply section 450. The packet communication section 434 sequentially communicates with the corresponding device under test 500 a series of packets included in the packet list, which is sequentially specified by the flow control section 426 in the corresponding execution processing section 420 to test the corresponding device under test 500.

The packet communication section 434 reads the packet list from the address which is received from the flow control section 426, and sequentially communicates with the corresponding device under test 500 a series of packets included in the read packet list for example. In addition, the packet communication section 434 transmits the data value contained in the packet which is received from the device under test 500 to the variable storing section 412 in the arithmetic processing section 410 through the flow control section 426.

The variable storing section 412 stores the data value which is received from each of the plurality of packet communication sections 434 included in the plurality of communication processing sections 430 as a variable value. The computing section 414 executes the arithmetic expressions included in the test program and transmits the result of operation to the flow control sections 426 in the plurality of execution processing section 420. In addition, when the arithmetic expression includes the data value which is received from the device under test 500, the computing section 414 reads the variable value being a parameter of the arithmetic expression from the variable storing section 412, and calculates according to the arithmetic expression. In addition, the computing section 414 may transmit to the packet communication section 434 the data value included in the packet which is transmitted to the device under test 500 as the variable value.

Such test apparatus 100 causes the arithmetic processing section 410 provided on the upper level to perform the arithmetic expression in the test program and causes the flow control section 426 and the packet communication section 434 provided on the lower level to perform the flow control. Thereby in the test apparatus 100, the arithmetic processing section 410 provided on the upper level is configured by a computationally-intensive processor to intensively control variables, meanwhile the flow control section 426 and the packet communication section 434 provided on the lower level are configured by processors or sequencers with high operating frequencies, therefore the test apparatus 100 can construct a system efficiently operating as a whole.

Moreover, such test apparatus 100 stores, as a variable, the data value which is received from the device under test 500 in the arithmetic processing section 410 on the upper level. Accordingly, the test apparatus 100 can reflect the contents of the packet which is received from one device under test 500 on a packet to be transmitted to another device under test 500.

Furthermore, in such test apparatus 100, since the data value received from the device under test 500 is transferred from the communication processing section 430 on the lower level to the arithmetic processing section 410 on the upper level, intricate operations can be performed on the received data. Then, since the test apparatus 100 transfers the result of operation from the arithmetic processing section 410 on the upper level to the communication processing section 430 on the lower level, data obtained by performing intricate operations on the received data can be included in a packet which is newly generated.

Figure 14:
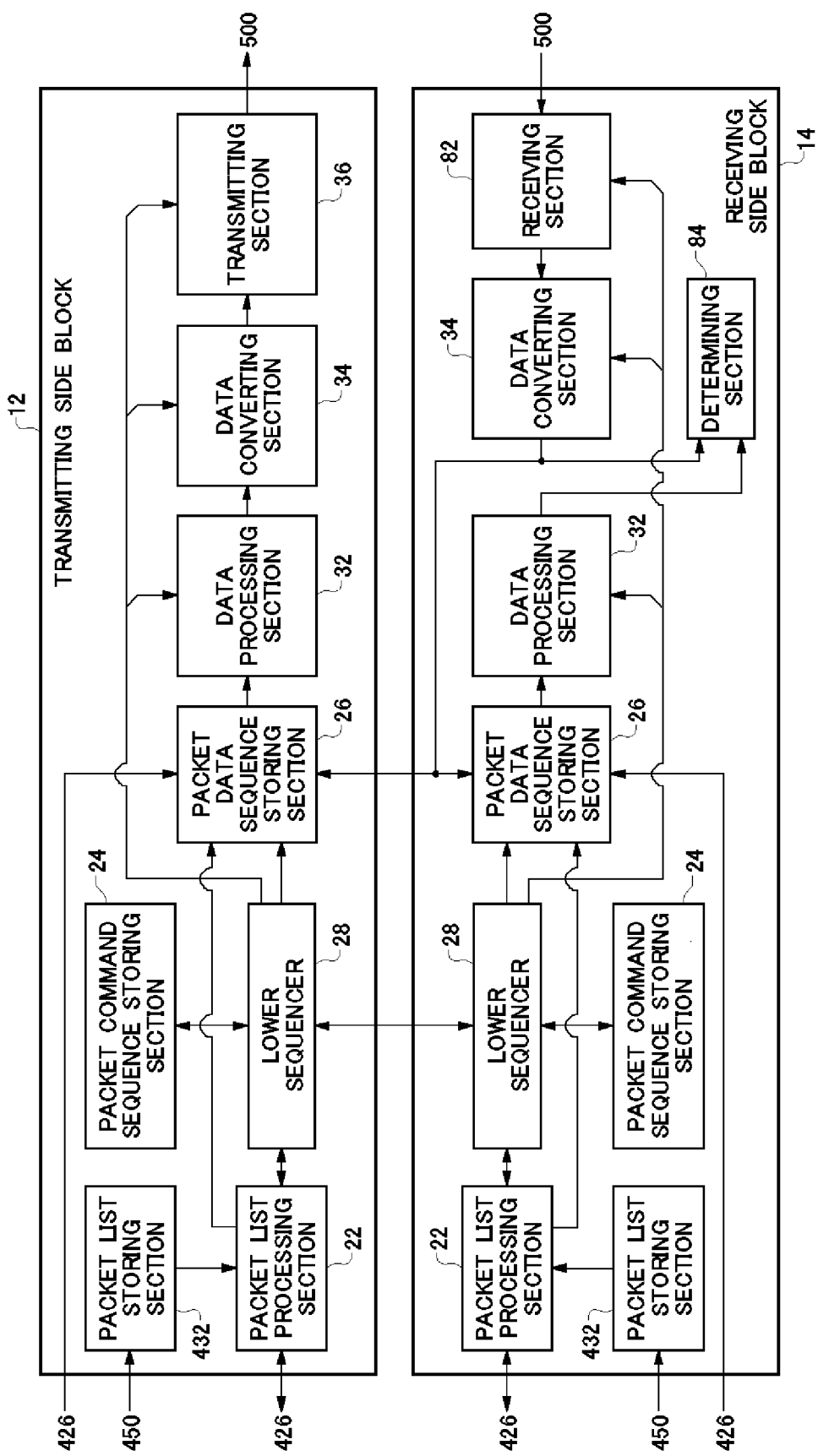
FIG. 14 shows a packet communication section 434 according to the present embodiment.

FIG. 14 shows a packet communication section 434 according to the present embodiment. The packet communication section 434 includes a transmitting side block 12 and a receiving side block 14. The transmitting side block 12 transmits packets to the device under test 500, in an order designated by the packet list. The receiving side block 14 receives the packet from the device under test 500 and compares the received packet and the packet designated by the packet list to determine pass/fail of the device under test 500.

First, the transmitting side block 12 will be described. The transmitting side block 12 includes a packet list storing section 432, a packet list processing section 22, a packet command sequence storing section 24, a packet data sequence storing section 26, a lower sequencer 28, a data processing section 32, a data converting section 34 and a transmitting section 36. The packet list storing section 432 stores a plurality of packet lists which are supplied from the program supply section 450.

The packet list processing section 22 executes the packet list designated by the flow control section 426, among the plurality of packet lists stored in the packet list storing section 432 to sequentially designate each packet which is communicated with the device under test 500. The packet list processing section 22 executes the packet list at an address which is received from the flow control section 426 to sequentially designate the packets to be transmitted to the device under test 500, for example.

The packet list processing section 22 designates addresses on the packet command sequence storing section 24 in which command sequences for generating the designated packets are stored, for example. Moreover, the packet list processing section 22, for the packet communicating with the device under test 500, designates the address of the data sequence which is included in the packet in the packet data sequence storing section 26 (e.g. the first address of the data sequence).

As described above, the packet list processing section 22 separately designates the address for generating a packet in the command sequence, and the address of the data sequence included in the packet. Here, in this case, when the same command sequence or data sequence is designated for two or more packets in the packet list, the packet list processing section 22 may designate the address of the same command sequence or the address of the same data sequence for the two or more packets.

The packet command sequence storing section 24 stores the command sequence for generating each of the plural types of packets, for each type of packets. The packet command sequence storing section 24 stores the command sequence for generating a write packet, the command sequence for generating a read packet, and the command sequence for generating an idle packet, for example.

The packet data sequence storing section 26 stores the data sequence included in the plural type of packets for each type of packet. The packet data sequence storing section 26 may include the data sequence contained in the write packet, the data sequence contained in the read packet, and the data sequence contained in the idle packet, for example. In addition, the packet data sequence storing section 26 may store distinctively on separate storage areas individual data which is changed for each packet and common data which is common for each type of packets, for example. Here, an exemplary configuration of the packet data sequence storage section 26 will be described later with reference to FIG. 15.

Moreover, the packet data sequence storing section 26 on the transmitting side receives, from the data converting section 34 in the receiving side block 14, received data contained in the packet which is received by the receiving section 82 in the receiving side block 14. Then, the packet data sequence storing section 26 on the transmitting side stores the received data contained in the packet, which is received by the receiving section 82 in the receiving side block 14.

The lower sequencer 28 reads, from the packet command sequence storing section 24, the command sequence of the packet designated by the packet list processing section 22, i.e. the command sequence of which address is designated by the packet list processing section 22, and executes sequentially each command contained in the read command sequence. Moreover, the lower sequencer 28 causes the packet data sequence storing section 26 to output the data sequence of the packet designated by the packet list processing section 22, i.e. the data sequence of which address is designated by the packet list processing section 22 in accordance with the execution of the command sequence, and generates a test data sequence used for performing a test on the device under test 500.

In addition, the lower sequencer 28 provides for the data processing section 32 and the data converting section 34 control data instructing to perform a designated processing (arithmetic processing or data converting) on the read individual data and common data every time the command is executed. The lower sequencer 28 therefore can make the designated part of data in the packet designated by the packet list processing section 22 as data obtained by performing the designates process on the read data.

Moreover, the lower sequencer 28 may give a notice of termination to the packet list processing section 22, in response to the termination of executing the command sequence of the packet which is designated by the packet list processing section 22. The packet list processing section 22 therefore can designate sequentially the packets, in response to the progress of executing the command sequence by the lower sequencer 28.

Moreover, the lower sequencer 28 on the transmitting side, which is included in the transmitting side block 12 designates, for the transmitting section 36, an edge timing of a signal to be transmitted to the device under test 500. The lower sequencer 28 provides the timing signal for the transmitting section 36 to control the edge timing for each packet, for example.

In addition, the lower sequencer 28 on the transmitting side communicates with the lower sequencer 28 on the receiving side which is included in the receiving side block 14. The lower sequencer 28 on the transmitting side therefore can perform a handshake with the lower sequencer 28 on the receiving side to execute the command sequence, in synchronism with the lower sequencer 28 on the receiving side.

The lower sequencer 28 on the transmitting side notifies the lower sequencer 28 on the receiving side that the test data sequence of a previously designated packet is transmitted to the device under test 500, for example. The lower sequencer 28 on the transmitting side can cause the lower sequencer 28 on the receiving side to prevent from determining acceptability of the received data sequence until receiving the notification from the lower sequencer 28 on the transmitting side.

In addition, the lower sequencer 28 on the transmitting side is notified from the lower sequencer 28 on the receiving side that the data sequence corresponding to the generated test data sequence is received, and generates a test data sequence of the packet previously designated, for example. Thereby the lower sequencer 28 on the transmitting side can transmit the packet which is previously designated to the device under test 500 after receiving a predefined packet from the device under test 500.

The data processing section 32 reads from the packet data sequence storing section 26 the data sequence of the packet designated by the packet list processing section 22, and generates a test data sequence used for testing the device under test 500. In this case, the data processing section 32 on the transmitting side may include a value corresponding to the received data contained in the packet which is received by the receiving section 82 in the receiving side block 14 in the test data sequence corresponding to the packet which is transmitted to the device under test 500.

For example, the data processing section 32 on the transmitting side reads data from the packet data sequence storing section 26 on the transmitting side, and generates a test data sequence such that a previously designated part of the data sequence of the packet to be transmitted to the device under test 500 is made as a value corresponding to the received data (e.g. the value of the received data without change or a value obtained by processing the received data in any way). Such data processing section 32 on the transmitting side can include the data corresponding to the received data contained in the packet which is received from the device under test 500 in the packet and transmits the value. Here, an exemplary configuration of the data processing section 32 will be described later with reference to FIG. 16.

The data converting section 34 converts the test data sequence output from the data processing section 32 at the timing designated by the lower sequencer 28. The data converting section 34 performs such as 8B-10B conversion with a table which is previously set for the test data sequence, for example. Moreover, the data converting section 34 may perform a scramble processing on the test data sequence, for example. Then, the data converting section 34 outputs the converted data sequence.

The transmitting section 36 transmits the test data sequence generated by the data converting section 34 to the device under test 500. An exemplary configuration of the transmitting section 36 will be described later with reference to FIG. 17.

Next, the receiving side block 14 will be described. The receiving side block 14 has substantially the same configuration and function as those of the transmitting side block 12, therefore, the differences from the transmitting side block 12 will be described for the receiving side block 14.

The receiving side block 14 includes a packet list storing section 432, a packet list processing section 22, a packet command sequence storing section 24, a packet data sequence storing section 26, a lower sequencer 28, a data processing section 32, a data converting section 34, a receiving section 82 and a determining section 84. The receiving section 82 receives the data sequence of the packet from the device under test 500. An exemplary configuration of the receiving section 82 will be described later with reference to FIG. 18.

The data converting section 34 on the receiving side converts the data sequence which is received by the receiving section 82, at the timing designated by the lower sequencer 28 on the receiving side. The data converting section 34 on the receiving side performs 8B-10B conversion on the received data sequence with a preset table, for example. Moreover, the data converting section 34 on the receiving side may perform a descramble processing on the received data sequence, for example.

Then, the data converting section 34 on the receiving side supplies the converted data sequence to the determining section 84. In addition, the data converting section 34 on the receiving side may supply the converted data sequence to at least one of the packet data sequence storing section 26 on the receiving side and the packet data sequence storing section 26 on the transmitting side.

The packet list processing section 22 on the receiving side executes the packet list designated by the flow control section 426 and sequentially designates packets which are expected to be received from the device under test 500. In addition, the data processing section 32 on the receiving side supplies the generated test data sequence to the determining section 84.

The lower sequencer 28 on the receiving side causes the packet data sequence storing section 26 on the receiving side to output the data sequence of the packet which is expected to be output from the device wider test 500 as a test data sequence. In addition, the lower sequencer 28 on the receiving side designates, for the receiving section 82, a strobe timing for capturing the data value of the signal output from the device under test 500.

The determining section 84 receives the test data sequence from the data processing section 32 on the receiving side, while receiving the data sequence received from the data converting section 34 on the receiving side. The determining section 84 determines acceptability of communications with the device under test 500, based on a result obtained by comparing the received data sequence with the test data sequence. The determining section 84 includes a logic comparison section that compares the data sequence received by the receiving section 82 with the test data sequence to determine coincidence between them, and a test result memory that stores the comparison result, for example. In addition, the determining section 84 may notify the lower sequencer 28 on the receiving side that the data sequence received by the receiving section 82 corresponds to the designated data sequence, for example.

In addition, the lower sequencer 28 on the receiving side communicates with the lower sequencer 28 on the transmitting side. The lower sequencer 28 on the receiving side therefore can perform a handshake with the lower sequencer 28 on the transmitting side to execute the command sequence, in synchronism with the lower sequencer 28 on the transmitting side.

The lower sequencer 28 on the receiving side notifies the lower sequencer 28 on the transmitting side, of receiving the data sequence which is corresponds to the test data sequence generated by the lower sequencer 28 on the receiving side, for example. The lower sequencer 28 on the transmitting side 28 therefore can generate a test data sequence of the packet previously designated, in response to the notification of receiving the data sequence corresponding to the generated test data sequence from the lower sequencer 28 on the receiving side.

In addition, the lower sequencer 28 on the receiving side prohibits the determining section 84 from determining acceptability of the data sequence which has been received by the receiving section 82 until receiving a notification of transmitting the test data sequence of the packet previously designated to the device under test 500, from the lower sequencer 28 on the transmitting side. The lower sequencer 28 on the receiving side therefore can determine whether a response corresponding to a predetermined packet is output from the device under test 500 after the predetermined packet is transmitted to the device under test 500.

The packet data sequence storing section 26 on the receiving side receives, from the data converting section 34 in the receiving side block 14, the received data contained in the packet which has been received by the receiving section 82. Then, the packet data sequence storing section 26 on the receiving side stores the received data contained in the packet which has been received by the receiving section 82.

Moreover, the data processing section 32 on the receiving side includes, in the test data sequence contained in the packet which is expected to be output from the device under test 500, the value corresponding to the received data contained in the packet which has been received by the receiving section 82. For example, the data processing section 32 on the receiving side reads data from the packet data sequence storing section 26 on the receiving side, and generates a test data sequence such that a part previously designated in the data sequence of the packet expected to be received from the device under test 500 is made as the value corresponding to the received data (e.g. the value of the received data without change or the value obtained by processing the received data in any way).

For example, the data processing section 32 on the receiving side May include, in the test data sequence corresponding to a second packet to be received from the device under test 500, the value corresponding to the received data contained in a first packet which has been received by the receiving section 82. The data processing section 32 on the receiving side therefore can refer such as ID contained in the packet received from the device under test 500 and determine whether ID to be contained in subsequent packets is correct.

As described above, in the test apparatus 100 according to the present embodiment, the processing to include, in subsequent packets, the value corresponding to the received data contained in the received packet can be performed at a position relatively close to the device under test 500. The test apparatus 100 therefore can response in communication with the device under test 500 at a high speed.

In addition, it is preferred that the test apparatus 100 includes a data processing section 32 which is configured by an arithmetic processing unit with a relatively high operating frequency. The test apparatus 100 therefore can perform at a high speed the processing to generate data to be contained in subsequent packets, based on the data contained in the received packet.

Figure 15:
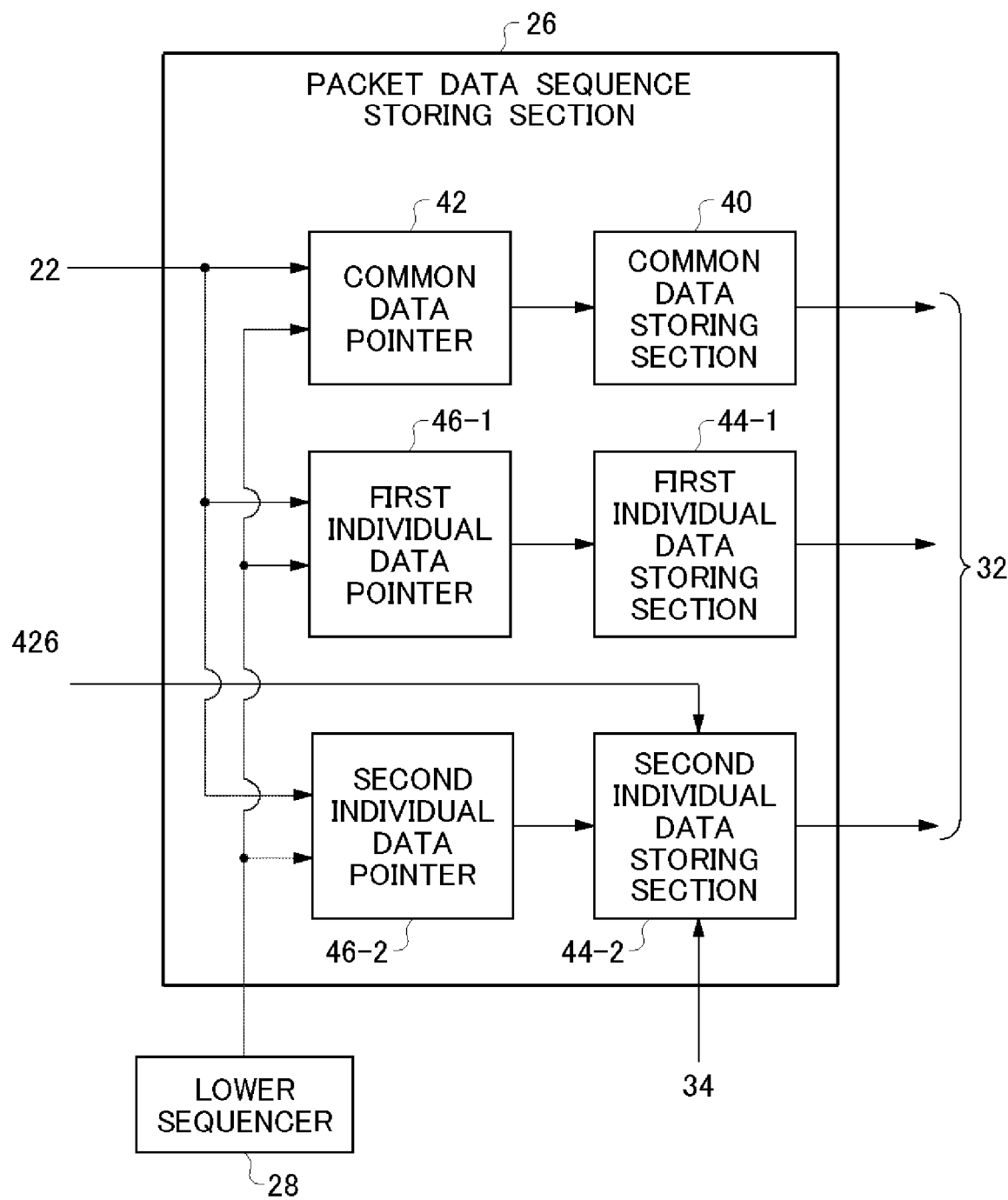
FIG. 15 shows an exemplary configuration of a lower sequencer 28 and a packet data sequence storing section 26 according to the present embodiment.

FIG. 15 shows an exemplary configuration of the lower sequencer 28 and the packet data sequence storing section 26 according to the present embodiment. The packet data sequence storing section 26 a common data storing section 40, a common data pointer 42, a first individual data storing section 441, a second individual data storing section 44-2, a first individual data pointer 46-1 and a second individual data pointer 46-2, for example.

The common data storing section 40 stores common data in the data sequence contained in each of plural different types of packets, which is common for the same type of packet. The common data storing section 40 stores, for each of the different types of packets, a start code indicative of the beginning of the packet, an end code indicative of the end of the packet and a command code for identifying a class of the packet, for example.

The common data pointer 42 acquires, from the packet list processing section 22, the first address of the block in which the common data contained in the packet which is designated by the packet list processing section 22 is stored. In addition, the common data pointer 42 acquires an offset position in the block from the lower sequencer 28. Then, the common data pointer 42 provides an address which is defined based on the first address and the offset position (e.g. the address obtained by adding the offset position to the first address) to the common data storing section 40, and causes the common data storing section 40 to supply the common data stored at the address to the data processing section 32.

The first and second individual data storing sections 44-1 and 44-2 store individual data changed for each packet, in the data sequence included in each of the plural types of packets. The first and second individual storing sections 44-1 and 44-2 may store entity data to be transmitted to the device under test 500 or entity data received from the device under test 500, which is included in each packet, for example.

The first individual data storing section 44-1 stores a predefined individual data regardless of the packet list to be executed. The second individual data storing sections 44-2 stores the individual data to be changed for each packet list to be executed. The second individual data storing section 44-2 appropriately receives the individual data transferred from the flow control section 426 in the execution processing section 420 before or during the test, for example.

Moreover, the second individual data storing section 44-2 receives the received data which has been received by the receiving section 82 from the data converting section 34 on the receiving side included in the receiving side block 14, and stores the received data as the individual data. The data processing section 32 therefore can read the received data from the second individual data storing section 44-2 and include it in the test data sequence.

The first and second individual data pointers 46-1 and 46-2 receive, from the packet list processing section 22, the first address of the block in which the individual data contained in the packet which is designated by the packet list processing section 22 is stored. Moreover, the first and second individual data pointers 46-1 and 46-2 acquire an offset position in the block from the lower sequencer 28. Then, the first and second individual data pointers 46-1 and 46-2 provide an address which is defined based on the first address and the offset position (e.g. an address obtained by adding the offset position to the first address) for the first and second individual data storing sections 44-1 and 44-2, and cause the first and second individual storing sections 44-1 and 44-2 to supply the individual data stored at the address to the data processing section 32.

The lower sequencer 28 provides, for the common data pointer 42, the individual data pointers 46-1 and the individual data pointer 46-2, the offset position indicative of the data position corresponding to the executed command, in the block in which the data sequence contained in the packet designated by the packet list processing section 22 is stored, for example. In this case, the lower sequencer 28 may generate an initial value by the first command and generate a count value incremented every time the executed command changes as an offset position. The lower sequencer 28 therefore can cause the packet data sequence storing section 26 to sequentially output the data sequence of the packet designated by the packet list processing section 22, i.e. the data sequence of which address is designated by the packet list processing section 22 according to the execution of the command sequence, and generate a test data sequence used for testing on the device under test 500.

In addition, the lower sequencer 28 designates, for the data processing section 32, a register among the registers of the common data storing section 40, the first individual data storing section 44-1, the second individual data storing section 44-2 and the data processing section 32, respectively, in which the data being subjected to the designated processing is stored every time the command is executed.

The lower sequencer 28 therefore can generate the part of data to be changed for each packet, in the packet designated by the packet list processing section 22 from the individual data which is read from the individual data storing section 44. In addition, the lower sequencer 28 can generate the part of data which is common for each type of packet, in the packet designated by the packet list processing section 22 from the common data read from the common data storing section 40. Moreover, the lower sequencer 28 can apply a designated processing on the designated part of data in the packet designated by the packet list processing section 22.

Figure 16:
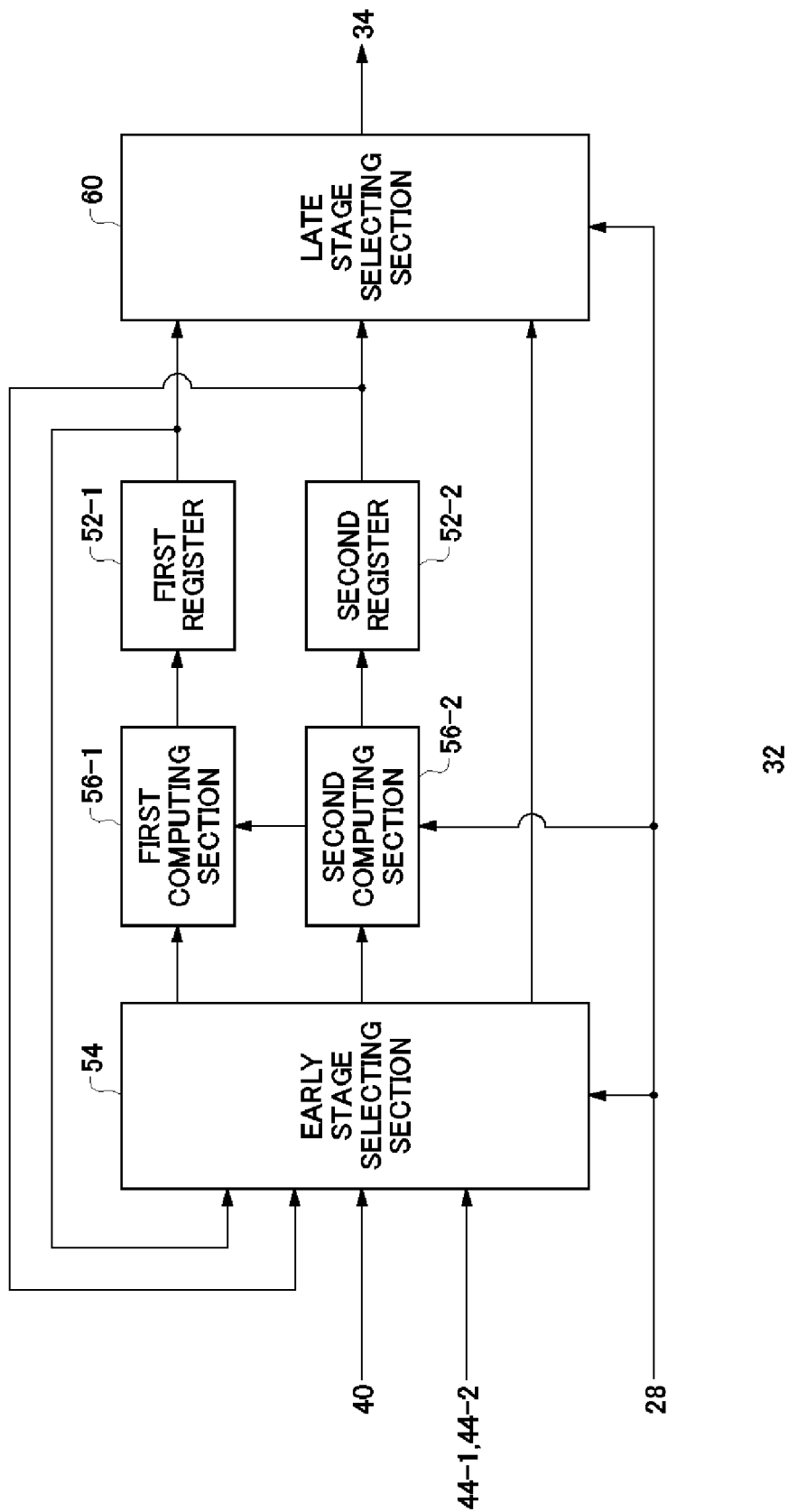
FIG. 16 shows an exemplary configuration of a data processing section 32 in a transmitting side block 12 according to the present embodiment.

FIG. 16 shows an exemplary configuration of the data processing section 32 in the transmitting side block 12 according to the present embodiment. The data processing section 32 in the transmitting side block 12 includes at least one registers 52, an early stage selecting section 54, at least one computing units 56 and a late stage selecting section 60, for example Each of at least one registers 52 stores the result of arithmetic processing in the previous cycle. According to the present embodiment, the data processing section 32 includes a first register 52-1 and a second register 52-2.

The early stage selecting section 54 selects, for each cycle, the data designated by the lower sequencer 28 among the common data from the common data storing section 40, the individual data from each individual data storing section 44 (the first individual data storing section 44-1 and the second individual data storing section 44-2 in the present embodiment) and the data from each register 52 (the first register 52-1 and the second register 52-2 in the present embodiment). Then, the early stage selecting section 54 supplies, for each cycle, each of the selected data to the computing unit 56 or the late stage selecting section 60 which is designated by the lower sequencer 28.

Each of at least one computing units 56 is provided for each of at least one registers 52 correspondingly. According to the present embodiment, the data processing section 32 includes a first computing unit 56-1 which corresponds to the first register 52-1 and a second computing unit 56-2 which corresponds to the second register 52. Each of the computing units 56 performs computing such as logical operation, four arithmetic operation, pseudorandom number generation and error correcting code generation, for example. Each of the computing units 56 performs, for each cycle, a computing designated by the lower sequencer 28 on the data selected by the early stage selecting section 54 and stores the resultant data in the corresponding register 52.

The late stage selecting section 60 selects, for each cycle, the data designated by the lower sequencer 28 between the data selected by the early stage selecting section 54 (the data from the common data storing section 40, the first individual data storing section 44-1 and the second individual data storing section 44-2) and the data in at least one of the registers 52. Then, the late stage selecting section 60 outputs the selected data as each data of the test data sequence.

Figure 17:
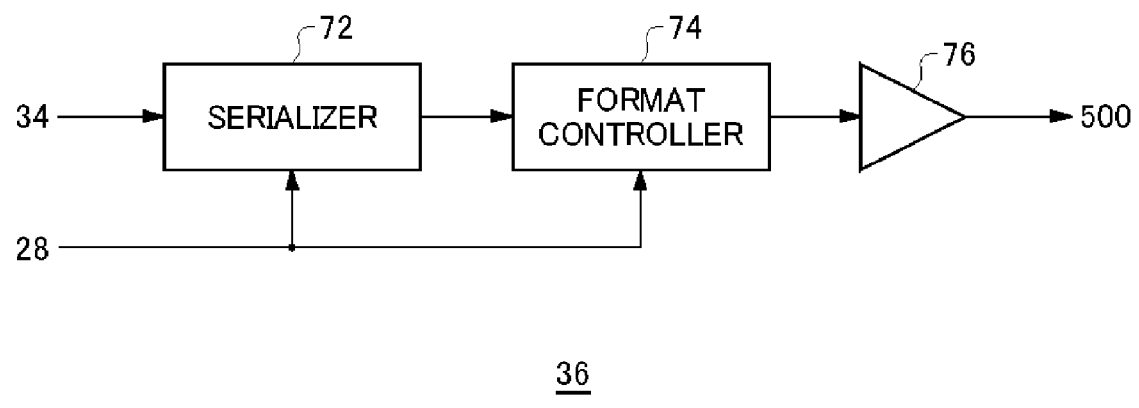
FIG. 17 shows an exemplary configuration of a transmitting section 36 in the transmitting side block 12 according to the present embodiment.

FIG. 17 shows an exemplary configuration of the transmitting section 36 in the transmitting side block 12 according to the present embodiment. The transmitting section 36 includes a serializer 72, a format controller 74 and a driver 76, for example.

The serializer 72 transforms the test data sequence received from the data processing section 32 into a serial waveform pattern. The format controller 74 generates a signal having a waveform corresponding to the waveform pattern which is received from the serializer 72. In addition, the format controller 74 outputs a signal having a waveform of which logic changes at an edge timing designated by the lower sequencer 28. The driver 76 supplies the signal output from the format controller 74 to the device under test 500.

Figure 18:
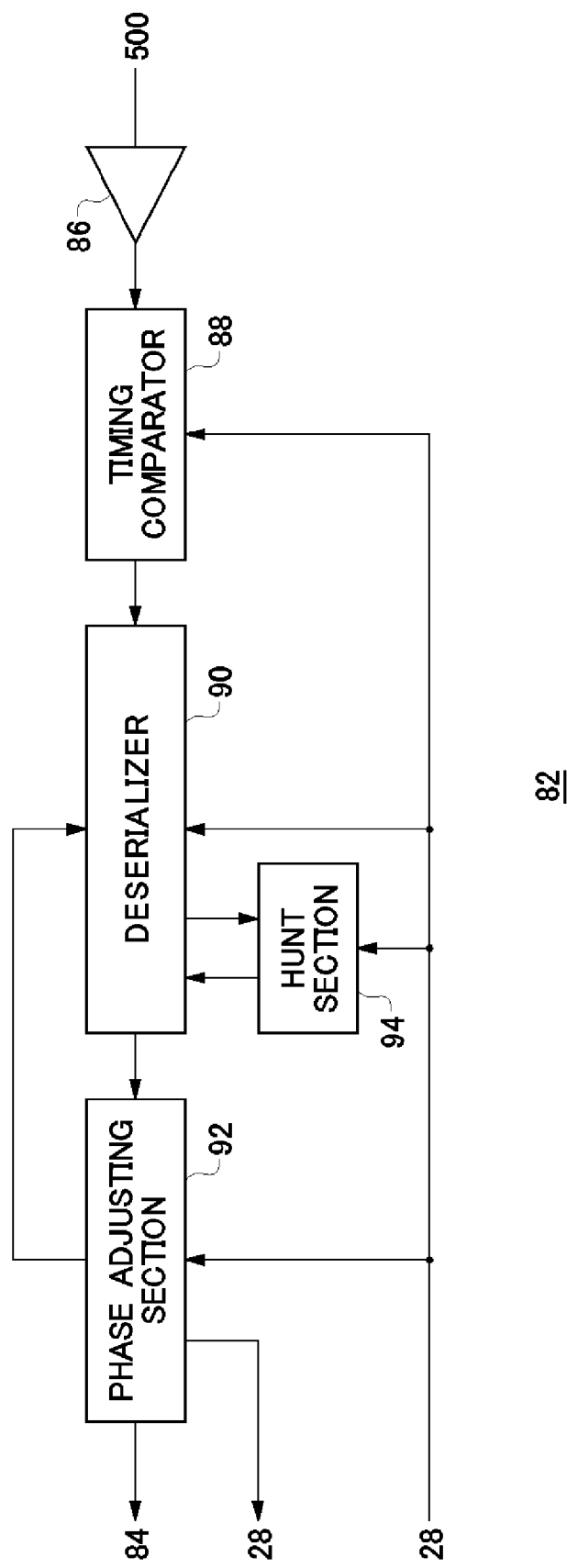
FIG. 18 shows an exemplary configuration of a receiving section 82 in a receiving side block 14 according to the present embodiment.

FIG. 18 shows an exemplary configuration of a receiving section 82 in a receiving side block 14 according to the present embodiment. The receiving section 82 includes a level comparator 86, a timing comparator 88, a deserializer 90, a phase adjusting section 92 and a hunt section 94.

The level comparator 86 compares the signal output from the device under test 500 with the threshold value and outputs a logic signal. The timing comparator 88 sequentially captures data of the logic signal output from the level comparator 86, at a strobe-timing designated by the lower sequencer 28.

The deserializer 90 transforms the data sequence captured by the timing comparator 88 into a parallel data sequence. The phase adjusting section 92 detects the specific code at the head of packets and adjusts extracting phases of the parallel data sequence by the deserializer 90. The hunt section 94 compares the data sequence captured by the timing comparator 88 with the specific code at the head of packets, and adjusts the head position of the packets in units of bits.

Such receiving section 82 can receive a packet output from the device under test 500 at an undefined timing. The receiving side block 14 therefore can compare the data sequence contained in the packet which is output from the device under test 500 at an undefined timing with the test data sequence which is expected to be output from the device under test 500.

FIG. 19 shows an exemplary packet list according to the present embodiment. The packet list describes a plurality of commands which are sequentially executed. The packet list describes NOP command, IDXI command, EXIT command and so forth, for example. The NOP command transfers an execution to a next command. The IDXI command transfers an execution to the next command after repeating the execution designated times. The EXIT command terminates the execution of the packet sequence.

In addition, the packet list describes a packet function corresponding to each command. For example, the packet list describes packet functions which generate a write packet, a read packet and an idle packet for generating a predefined code.

Moreover, the packet list describes, corresponding to each packet function, the first address of the command sequence for generating a packet to be specified by the packet function, and the first addresses of the common data and the individual data contained in the packet specified by the packet function. The packet list processing section 22 can execute such packet list to call the packet function corresponding to the executed command every time each command is sequentially executed.

FIG. 20 shows an exemplary packet function which is compiled and loaded into the packet communication section 434 according to the present embodiment. The packet function loaded into the packet communication section 434 describes a plurality of commands which are sequentially executed.

The packet function describes NOP command, IDXI command and RTN command, for example. The NOP command outputs once the data stored at the address designated by the pointer and transfers the execution to the next command. The IDXI command repeats the data stored at the address designated by the pointer designated times and outputs the data, and transfers the execution to the next command. RTN command outputs once the data stored at the address specified by the pointer and returns the execution to the packet list.

In addition, the packet function describes control data corresponding to each command. The control data includes arithmetic equations supplied to the computing unit 56, for example. As shown in FIG. 20, the control data includes a arithmetic equation (REG1=REG1^DB1 or REG1=REG1^DB2) that writes an exclusive OR between the data of the first register 52-1 and the output data back to the first register 52-1. Alternatively, the control data may designate a transform processing by the data converting section 34.

Moreover, the packet function describes, corresponding to each command, information for designating a storage location of the data to be output corresponding to the command. The packet function designates any of the common data storing section 40, the individual data storing section 44 and the register 52 as the storage location, for example.

As shown in FIG. 20, the hexadecimal number value 0×0F or 0×01 indicates the address of the common data storing section 40 as the storage location of the data. DB 1 indicates the first individual data storing section 44-1 as the storage location of the data. DB2 indicates the second individual data storing section 44-2 as the storage location of the data. REG 1 indicates the first register 52-1 as the storage location of the data. The lower sequencer 28 can execute the command sequences which are indicated by such packet functions to output the data sequence designated by each packet function.

Figure 21:
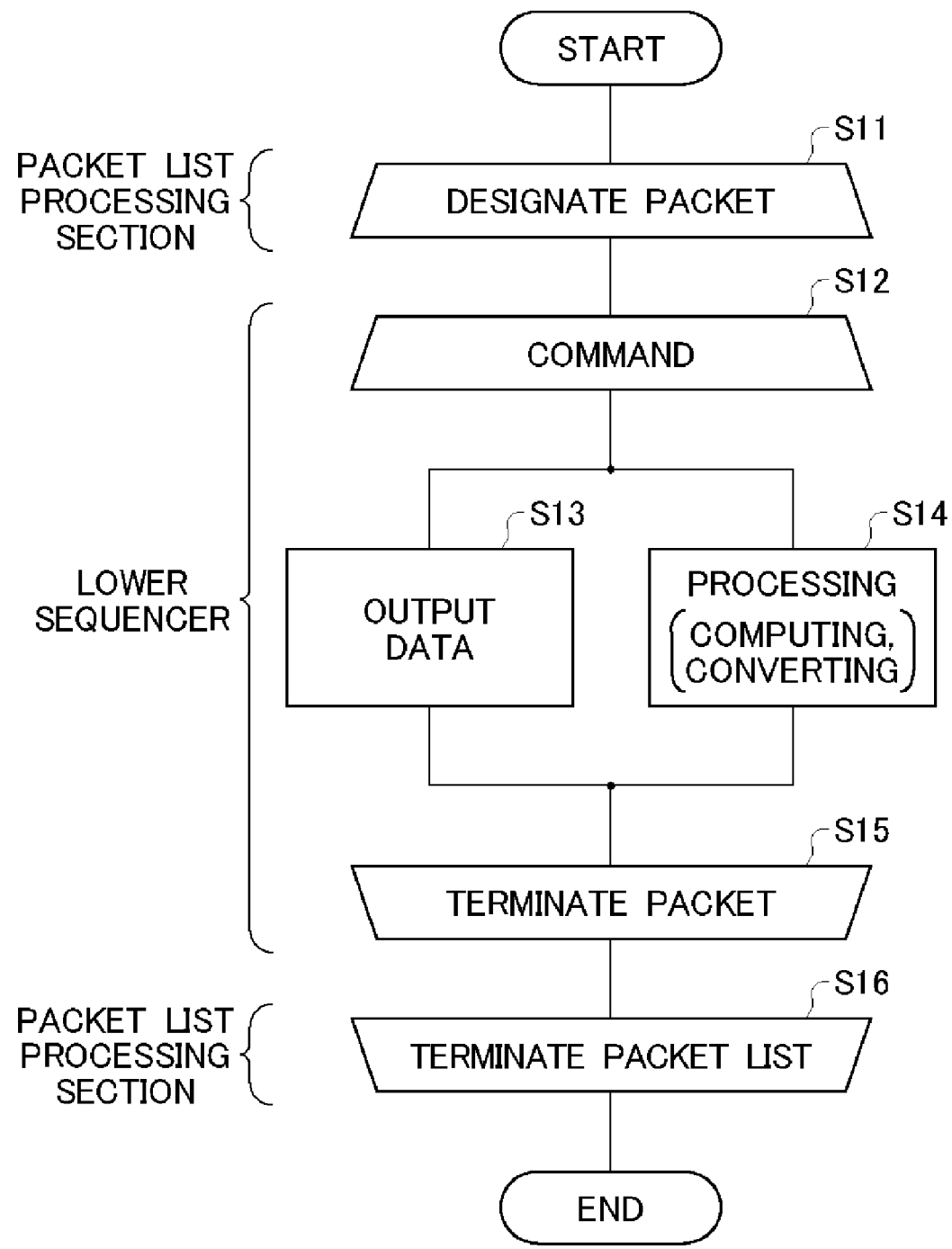
FIG. 21 shows a processing flow of the test apparatus 100 according to the present embodiment.

FIG. 21 shows a processing flow of the test apparatus 100 according to the present embodiment. First, the packet list processing section 22 executes the packet list and sequentially designates each packet to communicate with the device under test 500 (S11, S16). Then, in response to the designation of the packet by the packet list processing section 22, the lower sequencer 28 repeatedly executes processes from step S12 to step S15.

In response to the designation of the packet, the lower sequencer 28 calls the command sequence for generating the packet from the packet command sequence storing section 24 and executes sequentially commands from the first command. The lower sequencer 28 executes the processes of step S13 and step S14 every time each command is executed (S12, S15).

In the step S13, the lower sequencer 28 outputs the data corresponding to the command. Then, in the step S14, the lower sequencer 28 performs a computing or a data conversion, corresponding to the command. The lower sequencer 28 executes the step S13 and the step S14 in parallel.

After executing the last command, the lower sequencer 28 returns the process to the packet list processing section 22 and receives the designation of a next packet from the packet list processing section 22 (S15). Then, after completing the processes up to the last packet in the packet sequence, the packet list processing section 22 ends the flow (S16).

As described above, in the test apparatus 100 according to the present embodiment, the packet list indicating the packet sequence and the command sequence in the packet are executed by the separate sequencers. The test apparatus 100 therefore can make easy to describe a program. Moreover, in the test apparatus 100, the command sequence and the data for generating the common type of packets can be shared, so that the amount of information to be stored can be reduced.

Moreover, in the test apparatus 100 according to the present embodiment, the packet list processing section 22 separately designates the address of the command sequence executed by the lower sequencer 28, and the address of the data sequence read by the lower sequencer 28. The test apparatus 100 therefore can generate different data sequences with the same command sequence. Accordingly, the test apparatus 100 can reduce the amount of information to be stored because it is not necessary to store a plurality of same commands.

Moreover, in the test apparatus 100 according to the present embodiment, the data processing section 32 performs the designated process (i.e., computing or converting) on the data read from the common data storing section 40 and the individual data storing section 44. That is, the data processing section 32 can generate a data converting code and an error detecting code to be processed according to the rule of the lower layer (a layer close to the physical layer) in packet communications.

The test apparatus 100 therefore may generate the command sequence and the data sequence for outputting the data of the upper layer in packet communications, and designate separately the process in the lower layer in packet communication. Thus, the test apparatus 100 can easily describe the program and also reduce the amount of information to be stored.

Moreover, the test apparatus 100 according to the present embodiment separates the transmitting side block 12 that generates a test data sequence for transmitting a signal to the device under test 500 from the receiving side block 14 that generates a test data sequence to be compared with the signal received from the device under test 500, and each of the transmitting side block 12 and the receiving side block 14 has the racket list processing section 22 and the lower sequencer 28, respectively. The test apparatus 100 can separately describe the program for the transmitting side and the receiving side to make the program easy.

Then, the test apparatus 100 can communicate between the lower sequencer 28 in the transmitting side and the lower sequencer 28 in the receiving side. The test apparatus 100 therefore easily start operation on the receiving side in response to an event occurring in the transmitting side, as a trigger and also easily start operation on the transmitting side in response to an event occurring in the receiving side, as a trigger.

Here, the test apparatus 100 may include plural sets of the transmitting side blocks 12 and the receiving side blocks 14. In this case, the execution processing section 420 provides a separate sequence (a separate packet list) for each set of the transmitting side block 12 and the receiving side block 14 to execute them independently each another. The test apparatus 100 therefore can operate each set of the transmitting side block 12 and the receiving side block 14 asynchronously each other.

In addition, the execution processing section 420 may operate each set of the transmitting side block 12 and the receiving side block 14 synchronously each other. In this case, the execution processing section 420 provides the same sequence (the same packet list) for each set of the transmitting side block 12 and the receiving side block 14 to start to execute synchronously each other. The test apparatus 100 therefore can test a plurality of device under tests 500 provided with the same type or different types of packet communication interfaces in parallel.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A test apparatus for testing a device under test, comprising:
   test modules that communicate with the device under test to test the device under test;
   additional modules connected between the device under test and the test modules, each additional module performing a communication with the device under test, the communication being at least one of a communication performed at a higher speed and a communication performed with a lower latency, in comparison with a communication performed by the test modules;
   a test head having a plurality of connectors that connect the test modules and the additional modules, respectively, the test modules and the additional modules being mounted on the test head;
   a performance board placed on the test head that connects between at least a part of terminals of the plurality of connectors and the device under test, wherein
   the test modules are connected to the additional modules without through the performance board and
   wherein the test module includes:
      at least a first terminal connected to the device under test that communicates a packet with the device under test; and
      at least a second terminal connected to the additional module that controls the additional module.

2. The test apparatus according to claim 1, wherein each of the test modules is connected to each of the additional modules through at least one terminal of the connectors, which connect the test modules, of the test head.

3. The test apparatus according to claim 1, wherein the additional modules are connected to the test modules without through the connectors, which connect the test modules, of the test head.

4. The test apparatus according to claim 1, wherein
   the plurality of connectors with a same specification that connect at least one of the test modules and at least one of the additional modules are arranged on the test head, and
   each test module and each additional module are connected to two connectors, adjacent to one another, among the plurality of connectors.

5. The test apparatus according to claim 1, wherein
   the additional module receives a data signal transmitted from the device under test at a timing designated by a clock signal transmitted from the device under test, and
   the test module receives the data signal transmitted from the device under test at a timing designated by a clock of the test apparatus.

6. The test apparatus according to claim 5, wherein the additional module includes:
   an emulation section that emulates an external device connected to an external interface of the device under test, and
   a switching section that switches between the emulation section and the test module to which the external device of the device under test is connected.

7. The test apparatus according to claim 6, wherein when the external interface is connected to the test module to communicate the data signal between the test module and the device under test, the test module lowers a clock frequency supplied to the device under test, in comparison with a case where the external interface is connected to the emulation section to communicate the data signal between the emulation section and the device under test.

8. The test apparatus according to claim 6, further comprising an acquiring section that acquires and stores the data signal communicated between the device under test and the emulation section.

9. The test apparatus according to claim 8, wherein in response to an access from the test module, the acquiring section transmits an acquired data to the test module at the timing designated by the clock of the test apparatus.

10. The test apparatus according to claim 1, further comprising:
    a first test module connected to the device under test that communicates a packet with the device under test; and
    a second test module connected to the additional module that controls the additional module.

11. The test apparatus according to claim 1, wherein the test module includes:
    a packet list processing section that executes a test program for testing the device under test to sequentially designate each packet which is communicated with the device under test;
    a packet data sequence storing section that stores a data sequence contained in each of plural types of packets; and
    a lower sequencer that reads a data sequence of a packet designated by the packet list processing section from the packet data sequence storing section, and generates a test data sequence used for testing on the device under test.

12. The test apparatus according to claim 1, wherein the test module includes:
    a packet list storing section that stores a plurality of packet lists, each of which includes a series of packets being communicated with the device under test;
    a flow control section that designates an order of executing each of the packet lists, in accordance with an execution flow of a test program for testing the device under test; and
    a packet communication section that sequentially communicates the series of packets contained in the packet list which is sequentially designated by the flow control section to test the device under test.

13. The test apparatus according to claim 1, wherein the additional module communicates, with the device under test, a signal having a data value and a timing, wherein a test program can not specify the data value transmitted and received and the timing for transmitting and receiving the signal, and communicates, with the test module, a signal having a data value and a timing, wherein the test program can specify the data value transmitted and received and the timing for transmitting and receiving the signal.

14. The test apparatus according to claim 1, the additional module is connected to a memory interface through which the device under test accesses an external memory.

15. The test apparatus according to claim 14, wherein the additional module includes a switching section operable to connect the memory interface to one of the test modules.

16. The test apparatus according to claim 15, wherein the additional module further includes a test memory operable to receive a memory access from the memory interface and transmit or receive data to or from the device under test according to the memory access, and the switching section is further operable to connect the memory interface to the test memory.

17. The test apparatus according to claim 16, wherein the additional module further includes a direct current test unit operable to generate a voltage and a current to perform a direct current test on the device under test, and the switching section is further operable to connect the memory interface to the direct current test unit.

18. An additional module provided on the test apparatus according to claim 1.

* * * * *